(12) United States Patent　　　　　(10) Patent No.:　US 12,658,267 B2

Chen et al.　　　　　　　　　　　　　(45) Date of Patent:　　Jun. 16, 2026

(54) MEMORY WITH PAGE BUFFER PASS/FAIL CIRCUIT

(71) Applicant: YANGTZE MEMORY TECHNOLOGIES CO., LTD., Wuhan (CN)

(72) Inventors: Teng Chen, Wuhan (CN); Liang Qiao, Wuhan (CN); Masao Kuriyama, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 206 days.

(21) Appl. No.: 18/326,750

(22) Filed: May 31, 2023

(65) Prior Publication Data

US 2024/0194276 A1　　Jun. 13, 2024

Related U.S. Application Data

(63) Continuation of application No. PCT/CN2023/075741, filed on Feb. 13, 2023.

(30) Foreign Application Priority Data

Dec. 7, 2022　(CN) .......................... 202211563081.7

(51) Int. Cl.
　　*G11C 16/34*　　　　(2006.01)
(52) U.S. Cl.
　　CPC ................................ *G11C 16/3459* (2013.01)

(58) Field of Classification Search
　　CPC .. G11C 16/3459; G11C 11/4063; G11C 16/06
　　See application file for complete search history.

(56) References Cited

U.S. PATENT DOCUMENTS

| | | | | |
|---|---|---|---|---|
| 10,489,700 B1* | 11/2019 | Asnaashari | ............ | G06N 3/065 |
| 2012/0275222 A1* | 11/2012 | Choi | ...................... | G11C 29/52 |
| | | | | 365/185.09 |
| 2013/0088919 A1* | 4/2013 | Kim | ................... | G11C 16/3459 |
| | | | | 365/185.12 |
| 2021/0272639 A1* | 9/2021 | Dhotre | ................... | G06F 9/542 |
| 2022/0084597 A1* | 3/2022 | Mun | ................... | G11C 11/5671 |
| 2022/0262411 A1* | 8/2022 | Chai | ................... | G11C 29/021 |

FOREIGN PATENT DOCUMENTS

| | | |
|---|---|---|
| CN | 112951309 A | 6/2021 |
| CN | 114400041 A | 4/2022 |

* cited by examiner

*Primary Examiner* — Amir Zarabian
*Assistant Examiner* — Bradley S Coon
(74) *Attorney, Agent, or Firm* — Conley Rose, P.C.

(57)　　　　　ABSTRACT

A memory includes a memory cell array and a peripheral circuit, the peripheral circuit comprising at least a trigger circuit comprising a reference signal output circuit and a fail bit signal output circuit, wherein the fail bit signal output circuit is configured to generate a fail bit signal according to a test signal obtained from verification of the memory, and the reference signal output circuit is configured to output a plurality of reference signals; and a comparator coupled with the trigger circuit and configured to compare the fail bit signal with the at least one reference signal to output a verification result.

20 Claims, 17 Drawing Sheets

151

MEMORY WITH PAGE BUFFER PASS/FAIL CIRCUIT

CROSS-REFERENCE TO RELATED APPLICATIONS

This present application is a continuation of PCT/CN2023/075741 filed Feb. 13, 2023, titled "Memory, Control Method Thereof and Memory System," which claims the priority of China Patent Application No. 202211563081.7 filed on Dec. 7, 2022, titled "Memory And Its Control Method, Memory System," each of which is hereby incorporated herein by reference in its entirety.

TECHNICAL FIELD

The present disclosure relates to the field of semiconductor technology, and in particular relates to, but is not limited to, a memory, a control method thereof and a memory system.

BACKGROUND

A memory device having a three-dimensional (3D) structure has been developed to increase density of integration by disposing memory cells in three dimensions over a substrate. During production of 3D NAND memories, a process known as Verify Failbit Count (VFC) is performed in which memory cells go through write verification to count the number of memory cells in which any write failure or error occurs. Correspondingly, the circuit to perform VFC is called a VFC circuit.

SUMMARY

The present disclosure provides a memory, a control method thereof and a memory system.

In a first aspect, a memory comprising a memory cell array and a peripheral circuit is provided, the peripheral circuit comprising at least: a trigger circuit comprising a reference signal output circuit and a fail bit signal output circuit, wherein the fail bit signal output circuit is configured to generate a fail bit signal according to a test signal obtained from verification of the memory, and the reference signal output circuit is configured to output at least one reference signal; and a comparator coupled with the trigger circuit and configured to compare the fail bit signal with the at least one reference signal to output a verification result.

In some implementations, the reference signal output circuit comprises a plurality of branches connected in parallel and configured to output the at least one reference signal respectively, each of the branches comprising at least one controlled switch.

In some implementations, the controlled switches are configured so that the controlled switch having received a first enable signal is switched to an ON state for making the corresponding branch conductive and provide the reference signal.

In some implementations, the comparator comprises at least two comparators, and the reference signal output circuit comprises at least two sub output circuits, each of which comprises at least one said branch and is connected to one said comparator, wherein the number of the sub output circuits is equal to that of the comparators.

In some implementations, the comparator has an input terminal connected with the trigger circuit and are configured to: compare the fail bit signal with a reference signal to output a comparison parameter; continue the comparison with the next reference signal if the comparison parameter indicates that the fail bit signal is larger than the reference signal; or stop the comparison and output the verification result if the comparison parameter indicates that the fail bit signal is smaller than or equal to the reference signal.

In some implementations, the peripheral circuit further comprises a time delay circuit coupled with the comparator and configured to: receive a plurality of second enable signals sequentially to output delay signals; and delay a plurality of the comparison parameters output from the comparator according to the plurality of received delay signals respectively to output delayed comparison parameters.

In some implementations, the peripheral circuit further comprises a latch circuit comprising a plurality of latches coupled with the time delay circuit, wherein the latches are configured to store the delayed comparison parameters and the number of the latches is the same as that of the reference signals.

In some implementations, the latch circuit is also coupled with the trigger circuit, wherein the latches are configured to: convert the delayed comparison parameters into latch signals and latch the latch signals into the corresponding latches; and output a feedback signal according to the latch signals, wherein the feedback signal is configured to trigger the trigger circuit to switch the reference signal to be compared.

In some implementations, the memory further comprises a code system conversion circuit coupled with the latch circuit and configured to convert the latch signals into binary codes, wherein the binary codes are configured for calculation of the verification result.

In some implementations, the peripheral circuit further comprises an accumulator coupled with the code system conversion circuit and configured to accumulate a plurality of the binary codes obtained from the code system conversion circuit to obtain the verification result of the fail bit count.

In some implementations, the latch circuit is further configured to receive a reset signal to reset the latch signals.

In some implementations, the peripheral circuit further comprises a reference circuit connected with the trigger circuit and configured to output a control signal to the trigger circuit based on an externally input signal, wherein the control signal is configured to enable the trigger circuit.

In some implementations, the control signal comprises a first control signal and a second control signal, wherein the first control signal is configured to enable the reference signal output circuit to output a plurality of the reference signals and the second control signal is configured to enable the fail bit signal output circuit to receive the test signal.

In a second aspect, a control method of a memory is provided, wherein the control method is configured for a peripheral circuit of the memory, and the control method comprises: outputting at least one reference signal; generating a fail bit signal according to a test signal obtained from verification of the memory; and comparing the fail bit signal with the at least one reference signal to output a verification result.

In some implementations, the control method further comprises receiving a plurality of first enable signals sequentially, wherein a controlled switch having received the first enable signal is switched to an ON state, and a branch connected with the controlled switch at the ON state is conductive and is configured to provide the reference signal.

In some implementations, the comparing the fail bit signal with the plurality of reference signals to output a verification result comprises: comparing the fail bit signal with a reference signal to output a comparison parameter; delaying the comparison parameter according to a delay signal corresponding to the comparison parameter to output a delayed comparison parameter; converting the delayed comparison parameter into a latch signal and latching the latch signal into a corresponding latch; comparing the fail bit signal with a next reference signal if the latch signal indicates that the fail bit signal is larger than the reference signal, until the delayed comparison parameter indicates that the fail bit signal is smaller than or equal to the reference signal; converting the latch signals latched in a plurality of latches into binary codes respectively; and accumulating a plurality of the binary codes to obtain and output the verification result configured to represent a fail bit count.

In some implementations, the comparing the fail bit signal with the next reference signal if the latch signal indicates that the fail bit signal is larger than the reference signal comprises: outputting a feedback signal by the latch according to the latch signal; and outputting the first enable signal to a next controlled switch if the feedback signal indicates that the fail bit signal is larger than the reference signal, wherein the controlled switch having received the first enable signal is switched to an ON state, and the trigger circuit generates the next reference signal which is then compared with the fail bit signal.

In some implementations, the method further comprises receiving a reset signal to reset the latch signals.

In some implementations, the method further comprises outputting a control signal based on an externally input signal, wherein the control signal comprises a first control signal configured to enable a plurality of the reference signals to be output and a second control signal configured to enable the test signal to be received.

In a third aspect, a memory system is provided comprising: a memory controller and a memory of any one of the implementations above.

The memory provided by implementations of the present disclosure uses a multiplexed comparator coupled with the trigger circuit, wherein the comparator sequentially compares the fail bit signal generated by the trigger circuit with a plurality of reference signals output by the trigger circuit.

4

Figure 3:
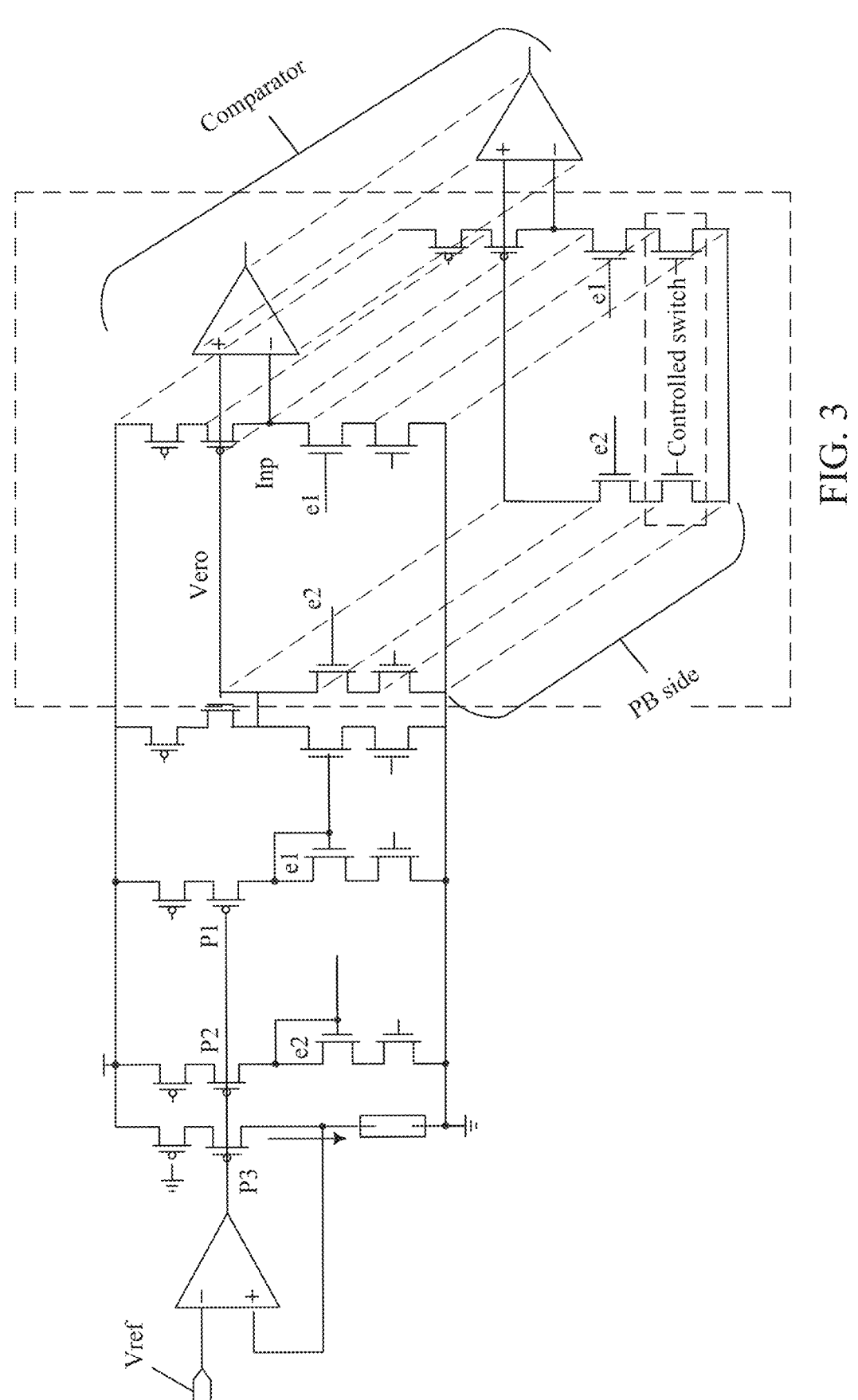

FIG. 3 is a schematic structural diagram of a trigger circuit connected with a comparator provided by an implementation of the present disclosure.

Figure 4:
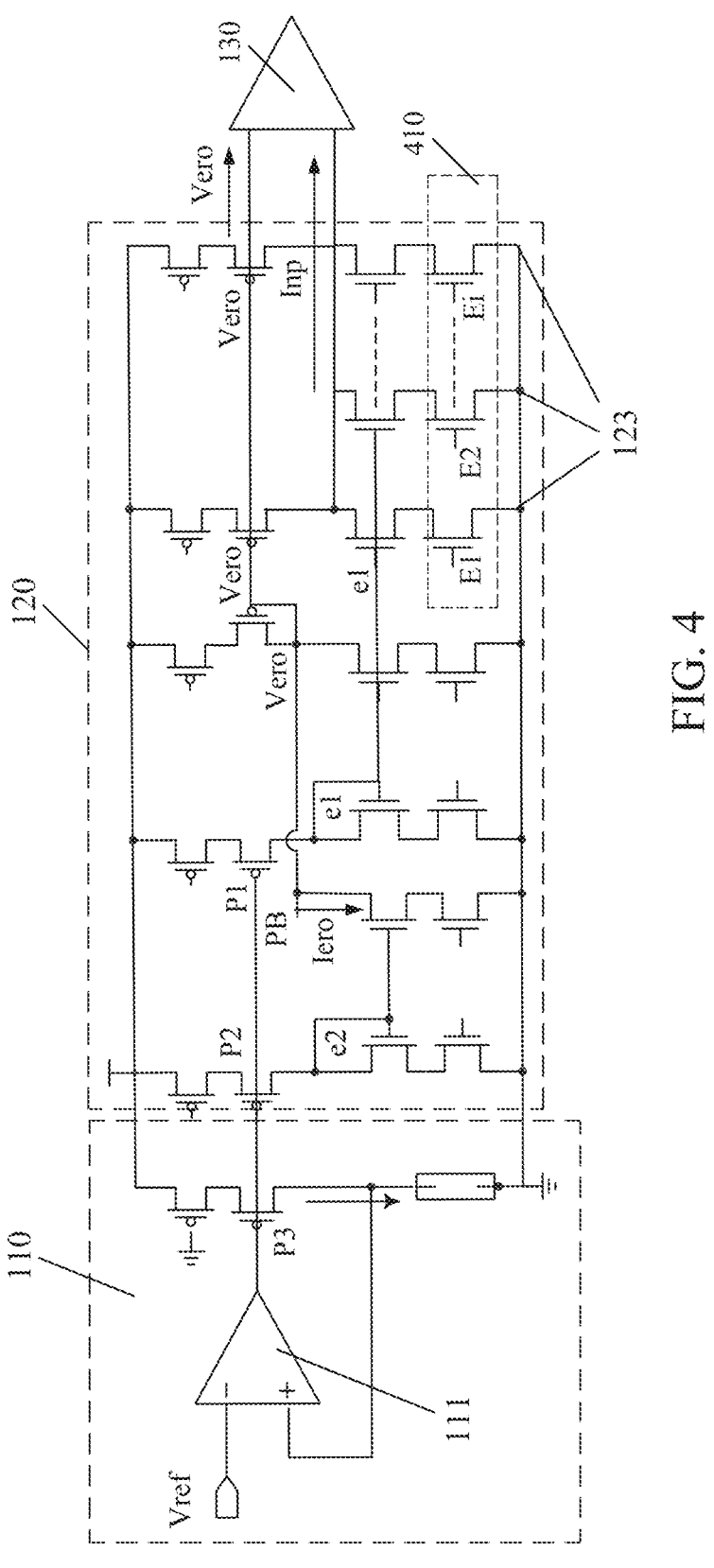

FIG. 4 is a schematic structural diagram of a controlled switch provided by an implementation of the present disclosure.

Figure 5:
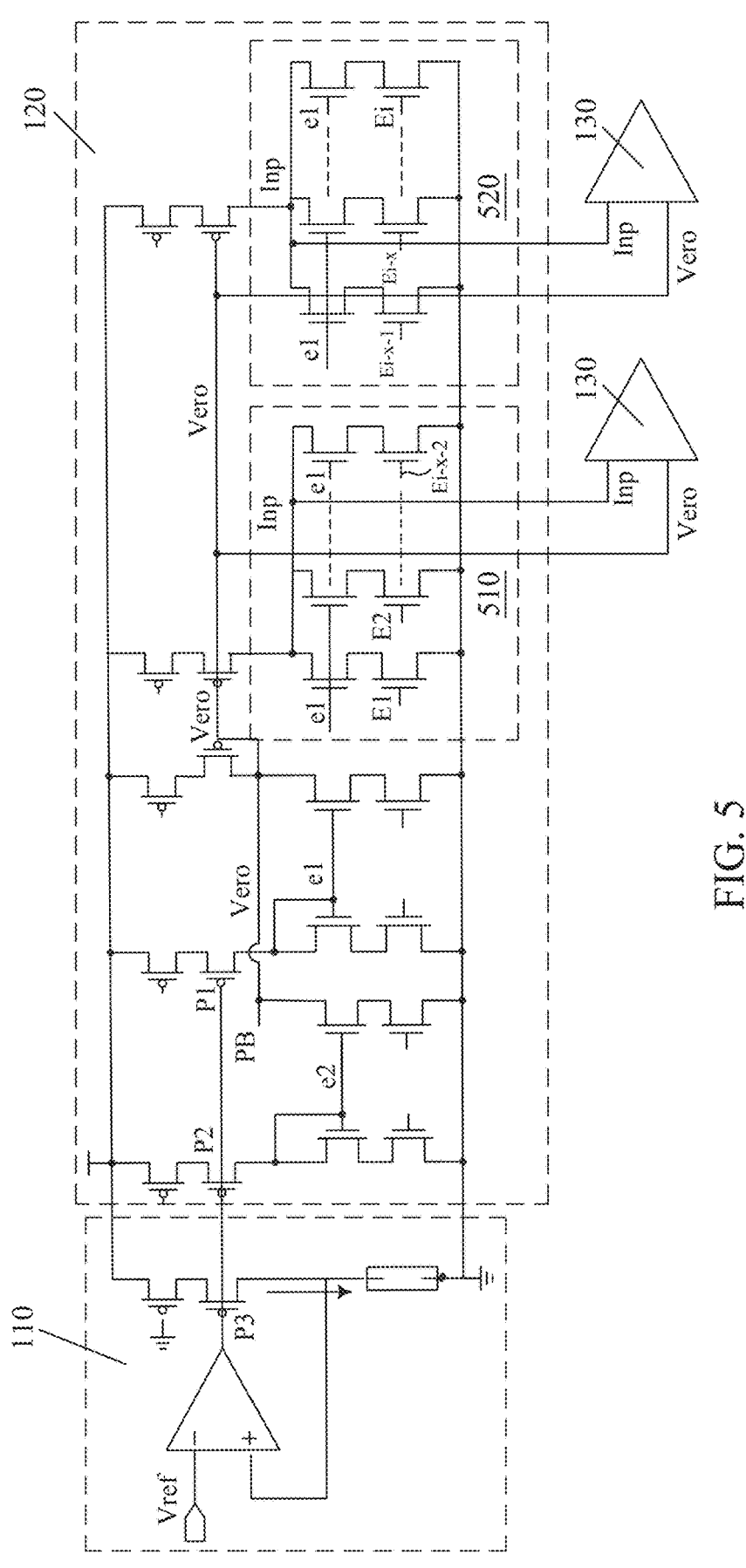

FIG. 5 is a schematic structural diagram of controlled switches arranged in groups provided by an implementation of the present disclosure.

Figure 6A:
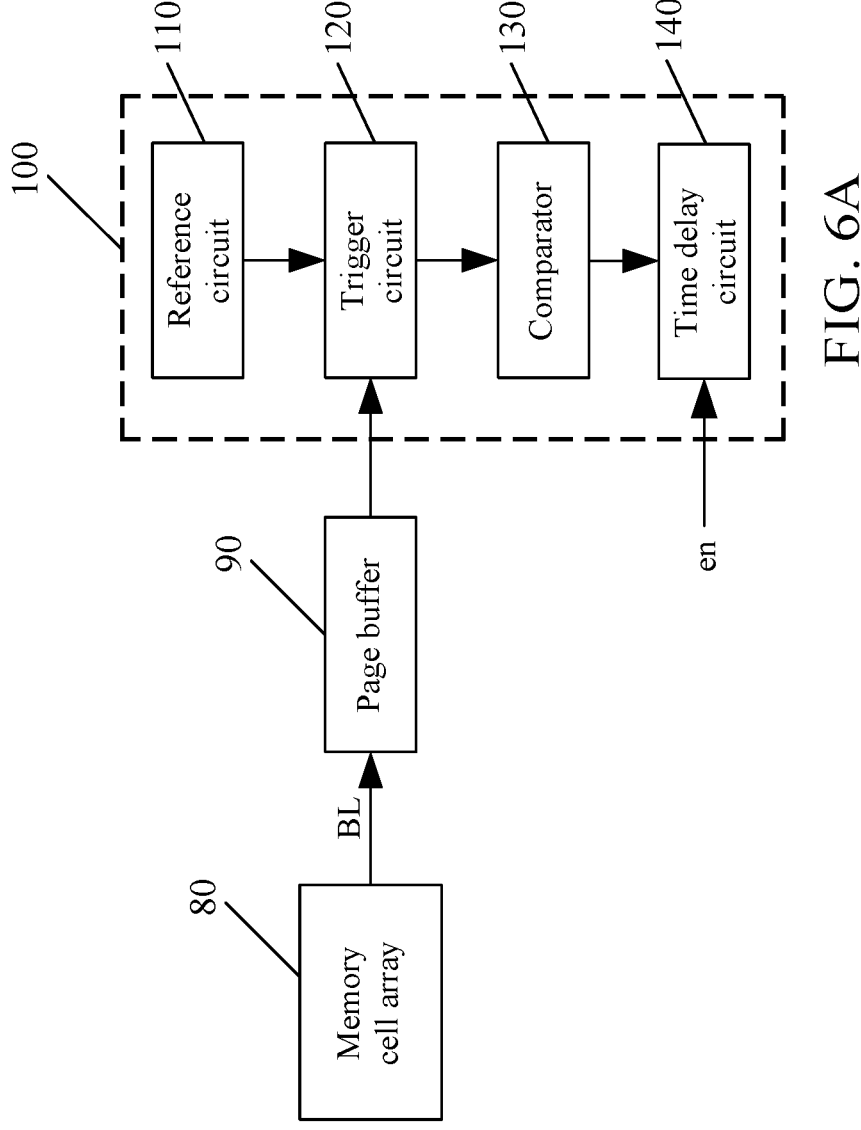
Figure 6B:
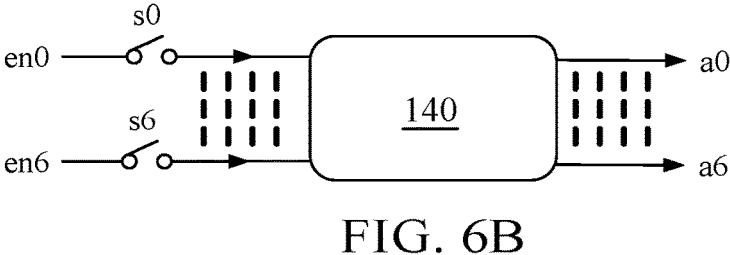

FIGS. 6A and 6B are schematic structural diagrams of a time delay circuit provided by an implementation of the present disclosure.

Figure 6C:
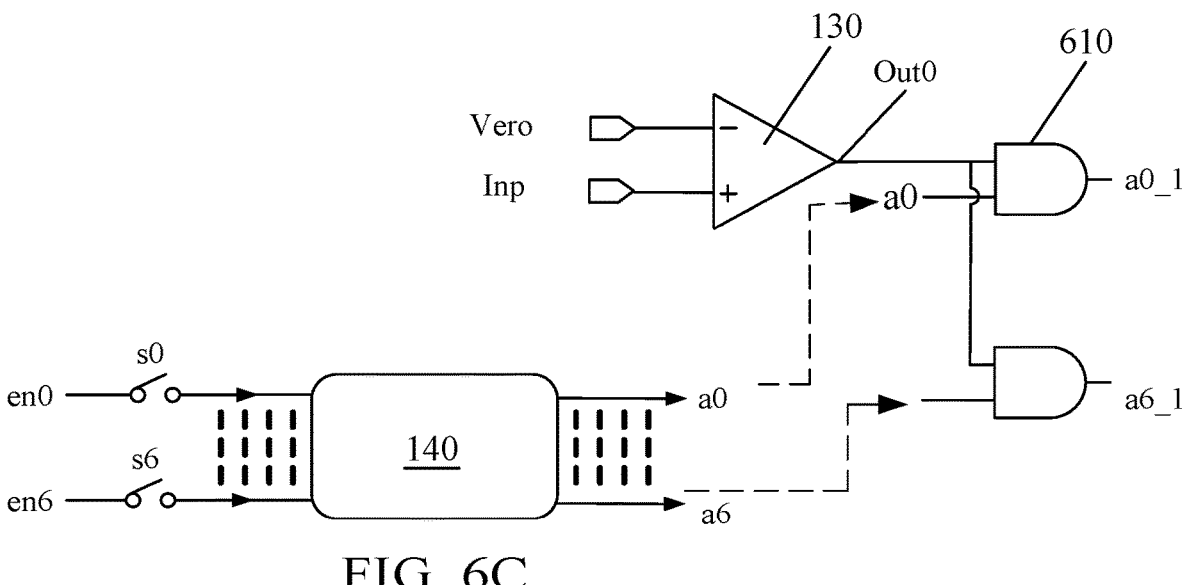

FIG. 6C is a schematic structural diagram illustrating how to input a delayed comparison parameter in accordance with an implementation of the present disclosure.

Figure 7A:
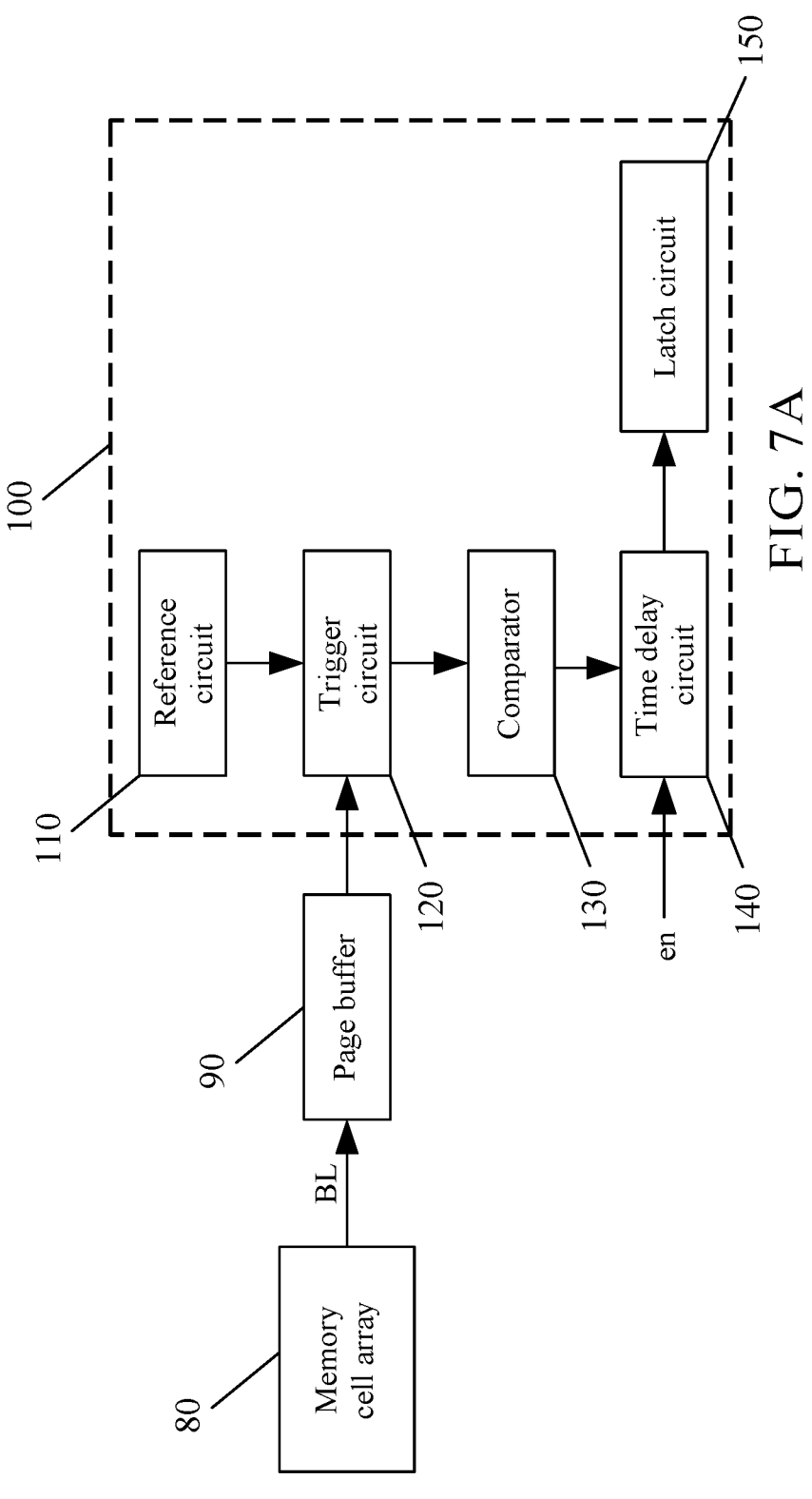
Figure 7B:
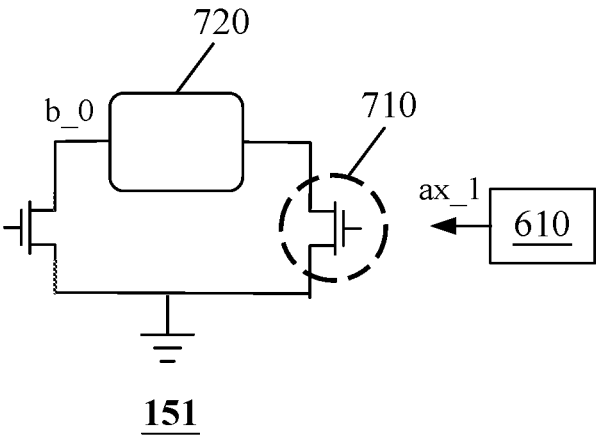
Figure 7C:
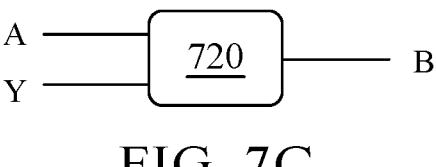

FIGS. 7A to 7C are schematic structural diagrams of a latch circuit provided by an implementation of the present disclosure.

Figure 8:
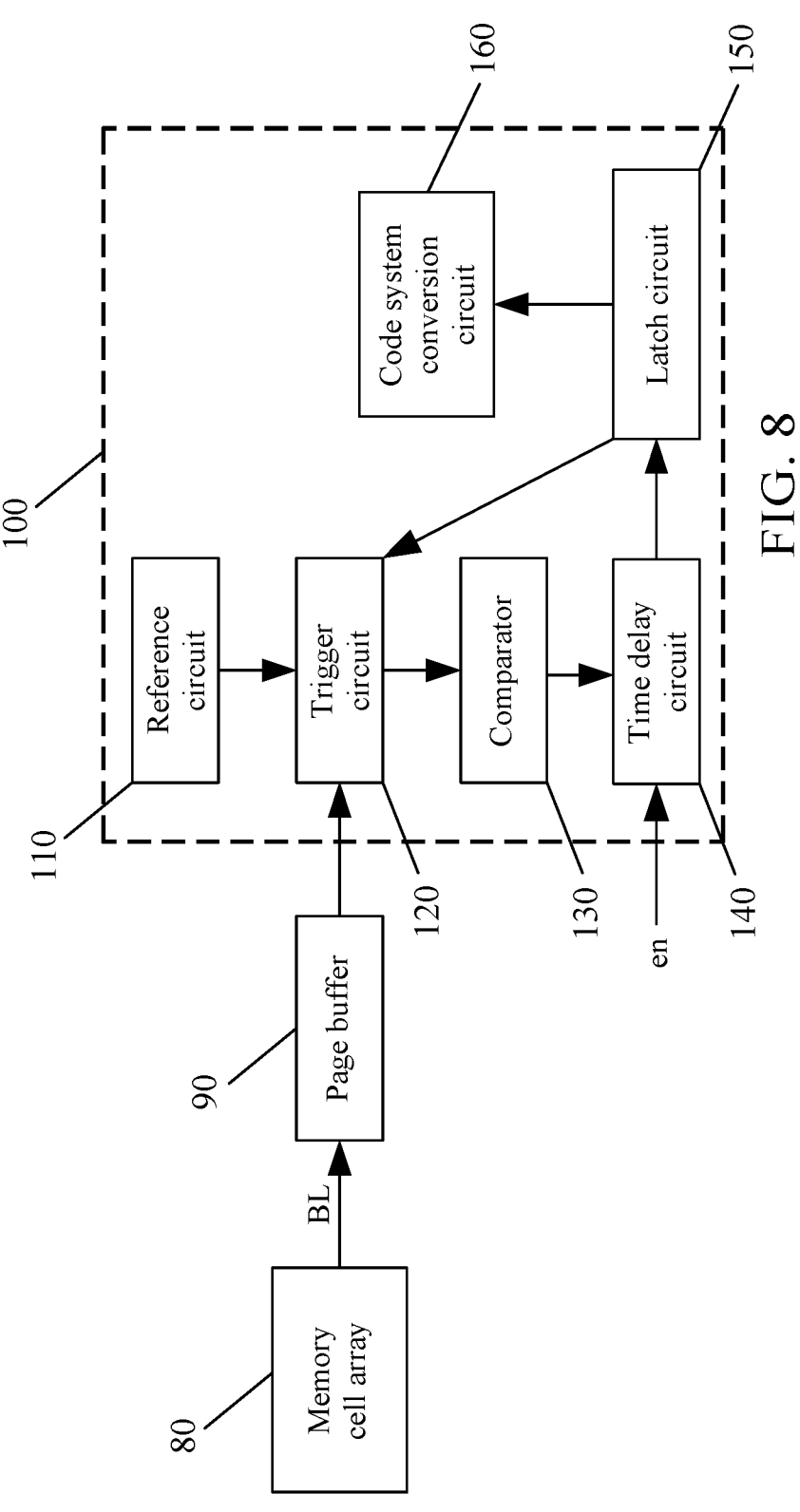

FIG. 8 is a schematic structural diagram of a code system conversion circuit provided by an implementation of the present disclosure.

Figure 9:
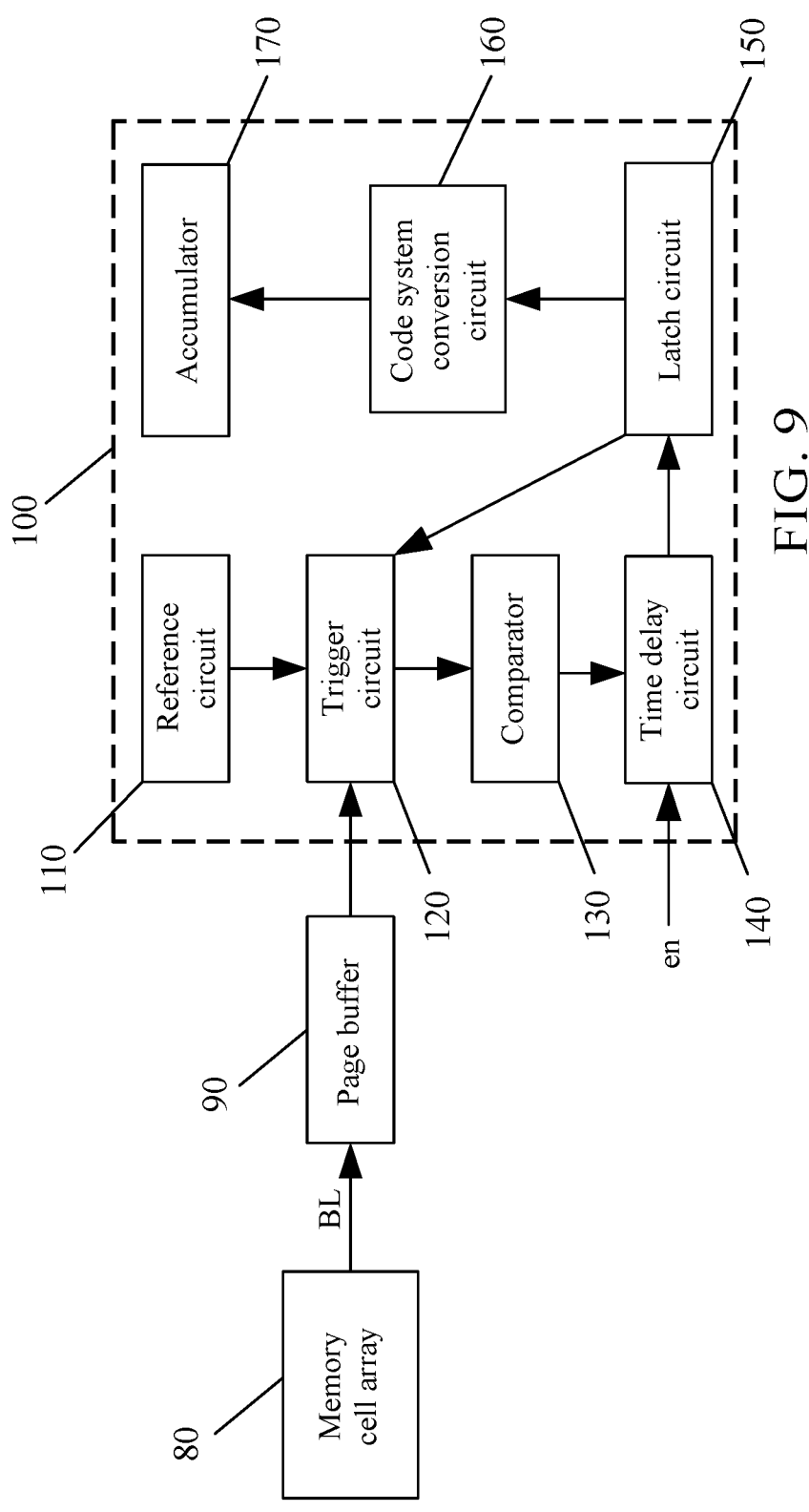

FIG. 9 is a schematic structural diagram of an accumulator provided by an implementation of the present disclosure.

Figure 10:
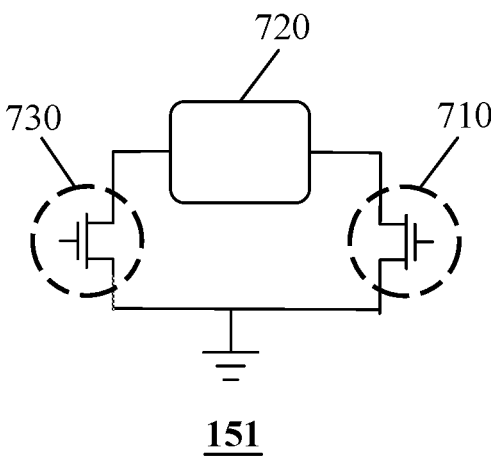

FIG. 10 is a schematic structural diagram of a latch provided by an implementation of the present disclosure.

Figure 11:
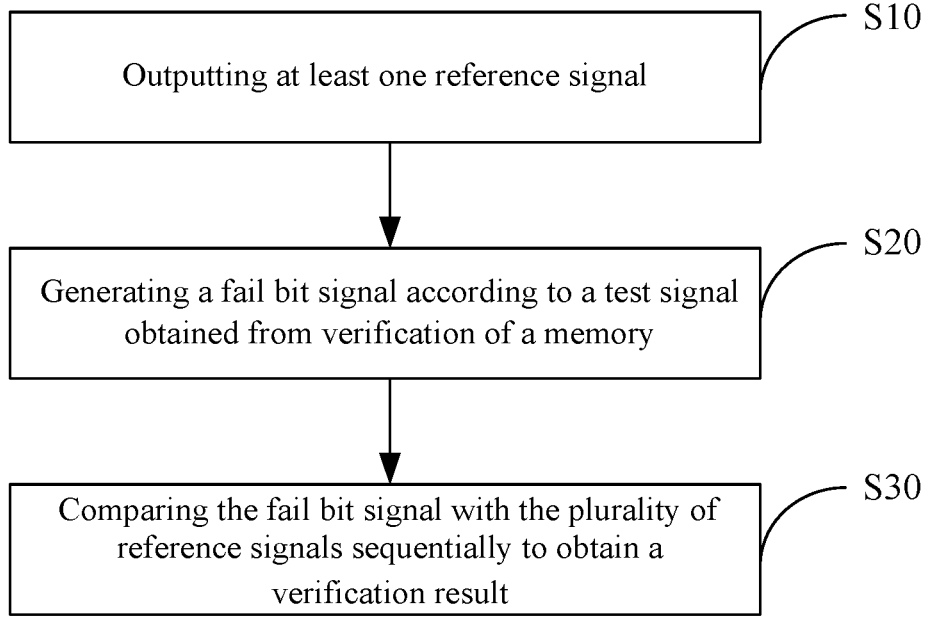

FIG. 11 is a flowchart illustrating steps of a control method of a VFC circuit provided by an implementation of the present disclosure.

Figure 12:
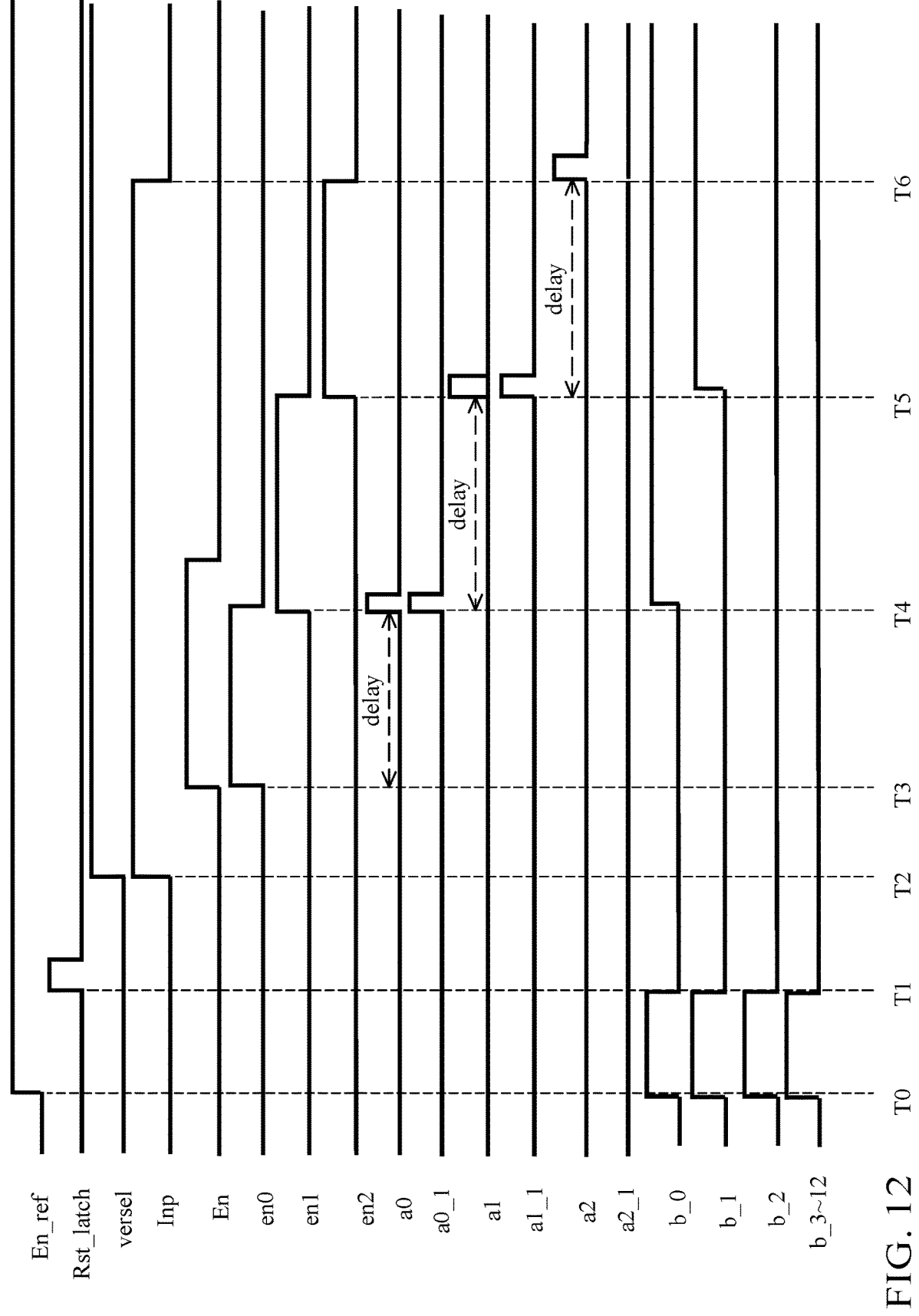

FIG. 12 is a timing diagram of a VFC circuit provided by an implementation of the present disclosure.

DETAILED DESCRIPTION

Implementations of the present disclosure are further described below in detail in conjunction with the drawings. Various implementations of the present disclosure are shown in the accompanying drawings. However, the present disclosure may be embodied in various forms without being limited to the implementations as described herein. Instead, the implementations are provided to make the present disclosure more thorough and complete.

The technical and scientific terms used herein have the same meanings as those commonly understood by those of ordinary skills in the technical field, to which the present disclosure belongs, unless otherwise defined. Terms used in the specification of the present disclosure are only for the purpose of describing specific implementations rather than limiting the present disclosure. The term "and/or" as used herein includes any and all combinations of one or more related listed items.

As described above, the circuit to perform VFC is called a VFC circuit. Running of the VFC circuit in a 3D NAND memory consumes power and occupies space of the memory. As a result, the VFC circuit needs to be optimized in design to reduce the power consumption and memory space occupation thereof.

Figure 1A:
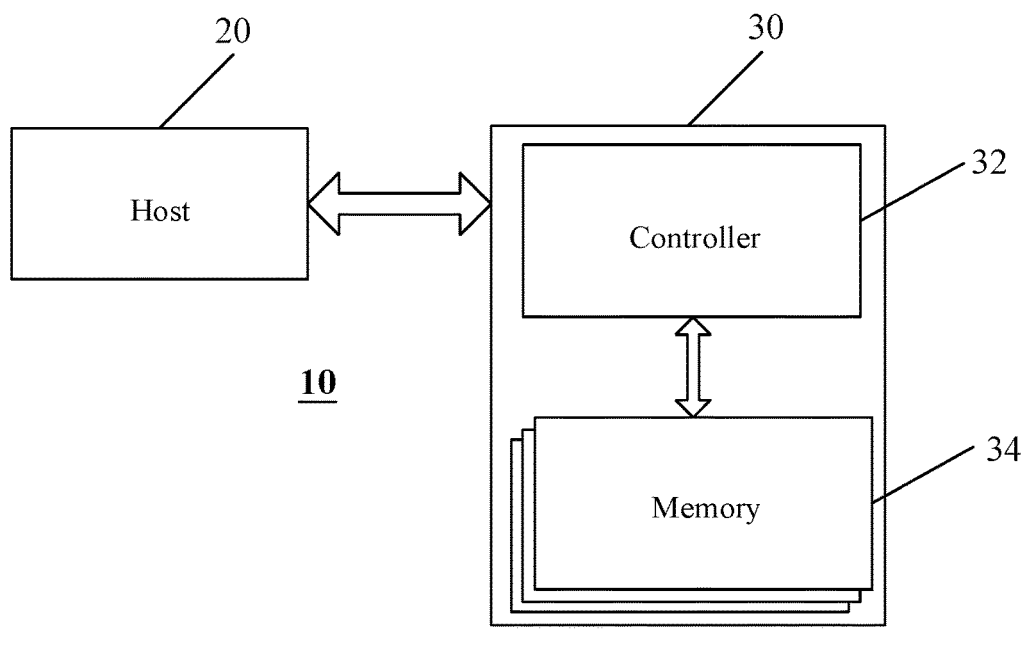
FIG. 1A is a schematic structural diagram of an example system provided by an implementation of the present disclosure.

As shown in FIG. 1A, an implementation of the present disclosure shows an example system 10 comprising a host 20 and a memory system 30. The example system 10 may include, but is not limited to, a mobile phone, a desk computer, a laptop computer, a tablet computer, a vehicle computer, a gaming console, a printer, a positioning device, a wearable electronic device, a smart sensor, a virtual reality (VR) device, an augmented reality (AR) device, or any other suitable electronic devices having a memory 34 therein. The host 20 may be a processor of an electronic device such as a central processing unit (CPU), or a system-on-chip (SoC) such as an application processor (AP).

The host 20 may be configured to send data to the memory system 30 or receive data from the memory system 30. The memory system 30 may include a controller 32 and one or more memories 34. The memory 34 may include, but is not limited to, a NAND flash memory, a vertical NAND flash memory, a NOR flash memory, a dynamic random access memory (DRAM), a ferroelectric random access memory (FRAM), a magnetoresistive random access memory (MRAM), a phase change random access memory (PCRAM), a resistive random access memory (RRAM), a nano random access memory (NRAM), etc.

The controller 32 may be coupled to the memory 34 and the host 20, and configured to control the memory 34. In some implementations, the controller 32 may be designed and configured to operate in a low duty-cycle environment, like a secure digital (SD) card, a compact flash (CF) card, a universal serial bus (USB) flash drive or any other medium configured to be used in an electronic device such as a personal computer, a digital camera or a mobile phone. In other implementations, the controller 32 is designed and configured to operate in a high duty-cycle environment like an SSD or an embedded multi-media-card (eMMC), used as a data storage for a mobile device such as a smart phone, a tablet computer or a laptop computer, and an enterprise storage array. Further, the controller 32 may manage the data in the memories 34 and communicate with the host 20. The controller 32 may be configured to control operations of the memories 34 such as reading, erasing and programming, manage various functions with respect to the data stored or to be stored in the memories 34 including, but not limited to, bad-block management, garbage collection, logical-to-physical address conversion, wear leveling, etc., and process error correction codes (ECCs) with respect to the data read from or written to the memories 34. In addition, the controller 32 may also perform any other suitable functions, for example, formatting the memories 34, or communicating with an external device (e.g., the host 20 in FIG. 1A) according to a particular communication protocol. The controller 32 may communicate with the external device through at least one of various interface protocols, such as a USB protocol, a MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 1B:
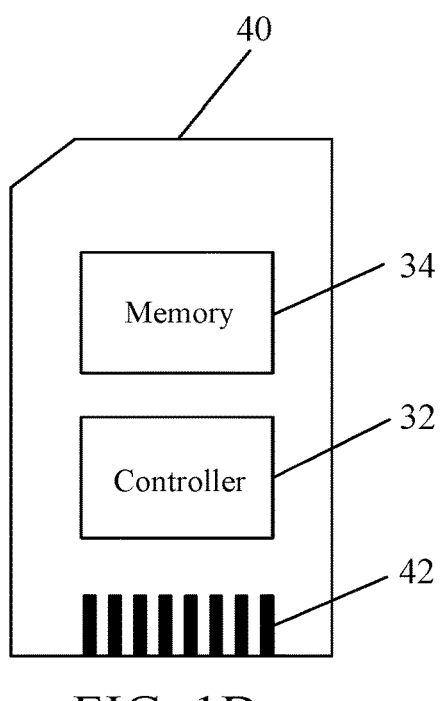
FIG. 1B is a schematic structural diagram of a memory card provided by an implementation of the present disclosure.
Figure 1C:
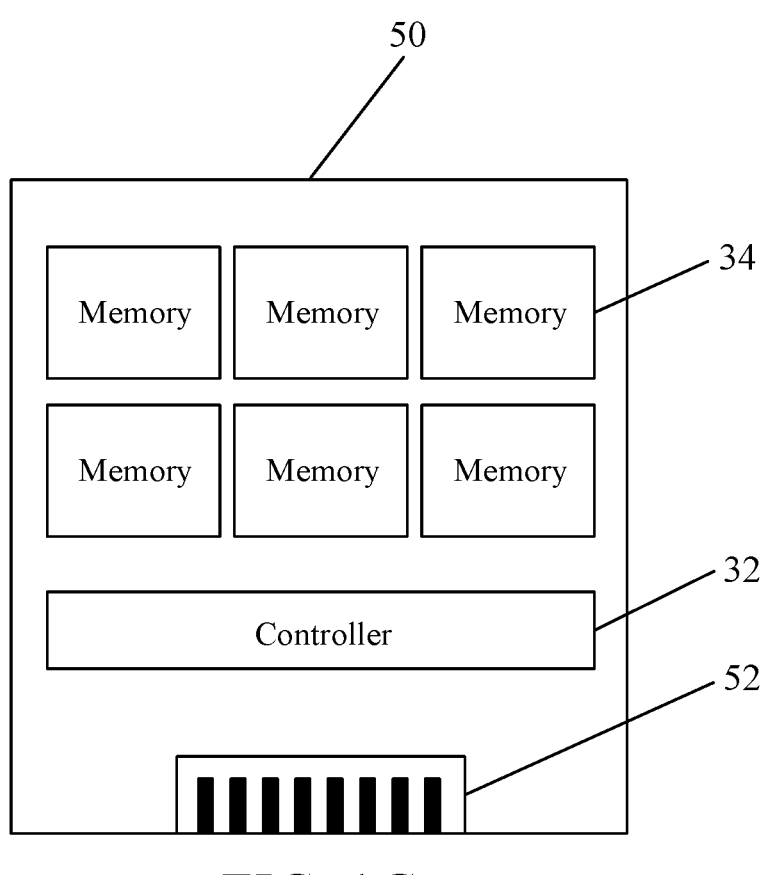
FIG. 1C is a schematically structural diagram of a solid-state drive (SSD) provided by an implementation of the present disclosure.

In one implementation of the present disclosure, the controller 32 and one or more memories 34 may be integrated into various types of storage devices, for example, be included in the same package, such as a universal Flash storage (UFS) package or an eMMC package. For example, the memory system 30 may be implemented and packaged into different types of end electronic products. As shown in FIG. 1B, the controller 32 and a single memory 34 may be integrated into a memory card 40. The memory card 40 may include a PC card (e.g., personal computer memory card international association (PCMCIA)), a CF card, a smart media (SM) card, a memory stick, a multimedia card (e.g., MMC, RS-MMC, MMCmicro), an SD card (e.g., SD, miniSD, microSD, SDHC), a UFS, etc. The memory card 40 may further include a memory card connector 42 coupling the memory card 40 with a host (e.g., the host 20 in FIG. 1A). In another implementation, as shown in FIG. 1C, the controller 32 and multiple memories 34 may be integrated into an SSD 50. SSD 50 may further include an SSD connector 52 coupling SSD 50 with a host (e.g., the host 20 in FIG. 1A). In some implementations, the storage capacity and/or the operation speed of SSD 50 is greater than those of the memory card 40.

Figure 1D:
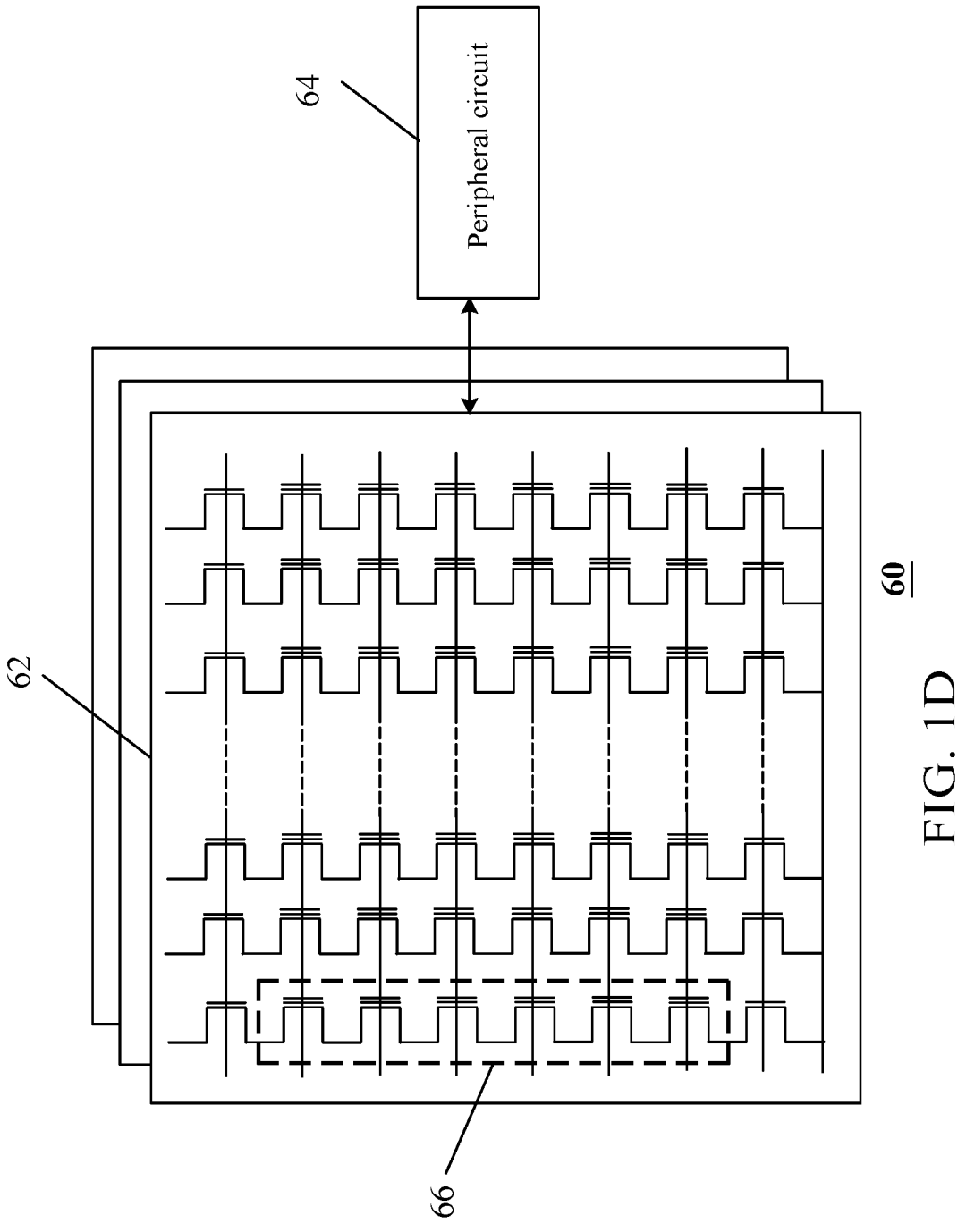
FIGS. 1D and 1E are schematic structural diagrams of a memory comprising a memory cell array and a peripheral circuit provided by an implementation of the present disclosure.

The memory, such as the memories 34, involved in the implementations of the present disclosure may be a semi-conductor memory that is a solid-state electronic device fabricated to store data information using a semiconductor integrated circuit process. FIG. 1D is a schematic diagram of an optional memory 60 in an implementation of the present disclosure. The memory 60 may be implemented as the memory 34 in FIGS. 1A to 1C. As shown in FIG. 1D, the memory 60 may comprise a memory cell array 62, a peripheral circuit 64 coupled to the memory cell array 62, and the like. The memory cell array 62 may be an NAND Flash memory cell array in which memory cells are provided in the form of an array of NAND memory strings 66 each extending vertically above a substrate (not shown). In some implementations, each NAND memory string 66 may include a plurality of memory cells coupled in series and stacked vertically. Each memory cell may hold a continuous analog value, such as an electrical voltage or charge, which depends on the number of electrons trapped within a region of the memory cell. In addition, each memory cell in the above-mentioned memory cell array 62 may be either a floating gate type of memory cell including a floating-gate transistor or a charge trap type of memory cell including a charge-trap transistor.

In one implementation of the present disclosure, the above-mentioned memory cell may be a single-level cell (SLC) that has two possible memory states and thus may store one bit of data. For example, the first memory state "0" may correspond to a first range of voltages, and the second memory state "1" may correspond to a second range of voltages. In some other implementations, each memory cell is a multi-level cell (MLC) that is capable of storing more than a single bit of data in more than four memory states. For example, the MLC may store two bits per cell, three bits per cell (also known as a triple-level cell (TLC)), or four bits per cell (also known as a quad-level cell (QLC)). Each MLC may be programmed to assume a range of possible nominal storage values. In an example, if each MLC stores two bits of data, the MLC may be programmed to assume one of three possible programming levels from an erased state by writing one of three possible nominal storage values to the cell. In such an example, a fourth nominal storage value may be configured as the erased state.

Figure 1E:
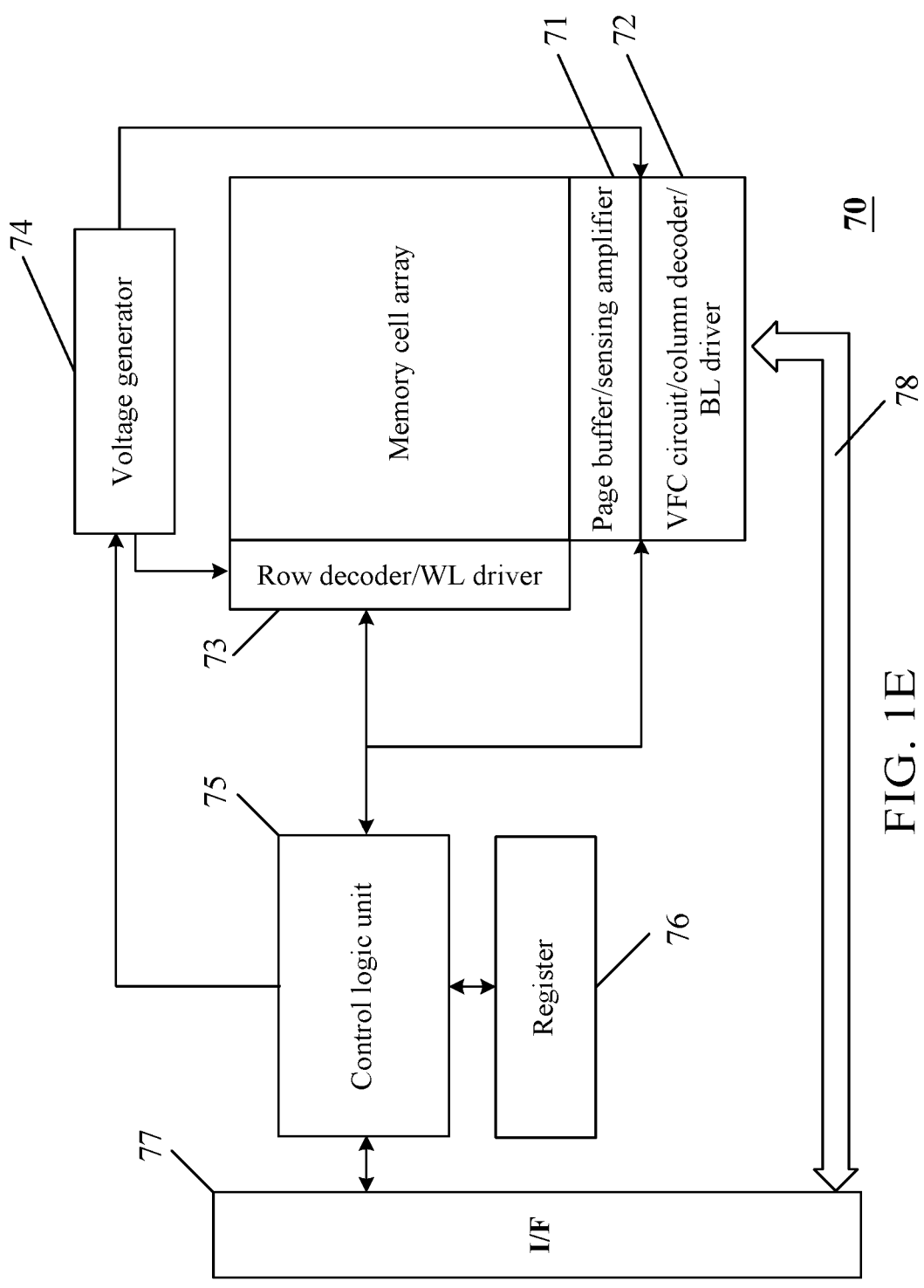

In one implementation of the present disclosure, the above-mentioned peripheral circuit may be coupled to the memory cell array 62 through a bit lines (BL), a word line (WL), a source line, a source select gate (SSG) and a drain select gate (DSG). The peripheral circuit may include any suitable analog, digital, and mixed-signal circuits, and thus may be configured to facilitate operations of the memory cell array 62 by applying voltage signals and/or current signals to each target memory cell and sensing voltage signals and/or current signals from each target memory cell through the bit line, word line, source line, SSG and DSG. In addition, the peripheral circuit may include various types of peripheral circuits formed using metal-oxide-semiconductor (MOS) technologies. As shown in FIG. 1E, a peripheral circuit 70 includes a page buffer/sense amplifier 71, a VFC circuit/column decoder/bit line driver 72, a row decoder/word line driver 73, a voltage generator 74, a control logic unit 75, a register 76, an interface (I/F) 77, and a data bus 78. The above-mentioned peripheral circuit 70 may be the peripheral circuit 64 in FIG. 1D and, in some other implementations, additional circuits not shown in FIG. 1E may be included in the peripheral circuit 70 as well.

Figures 1F, 2A:
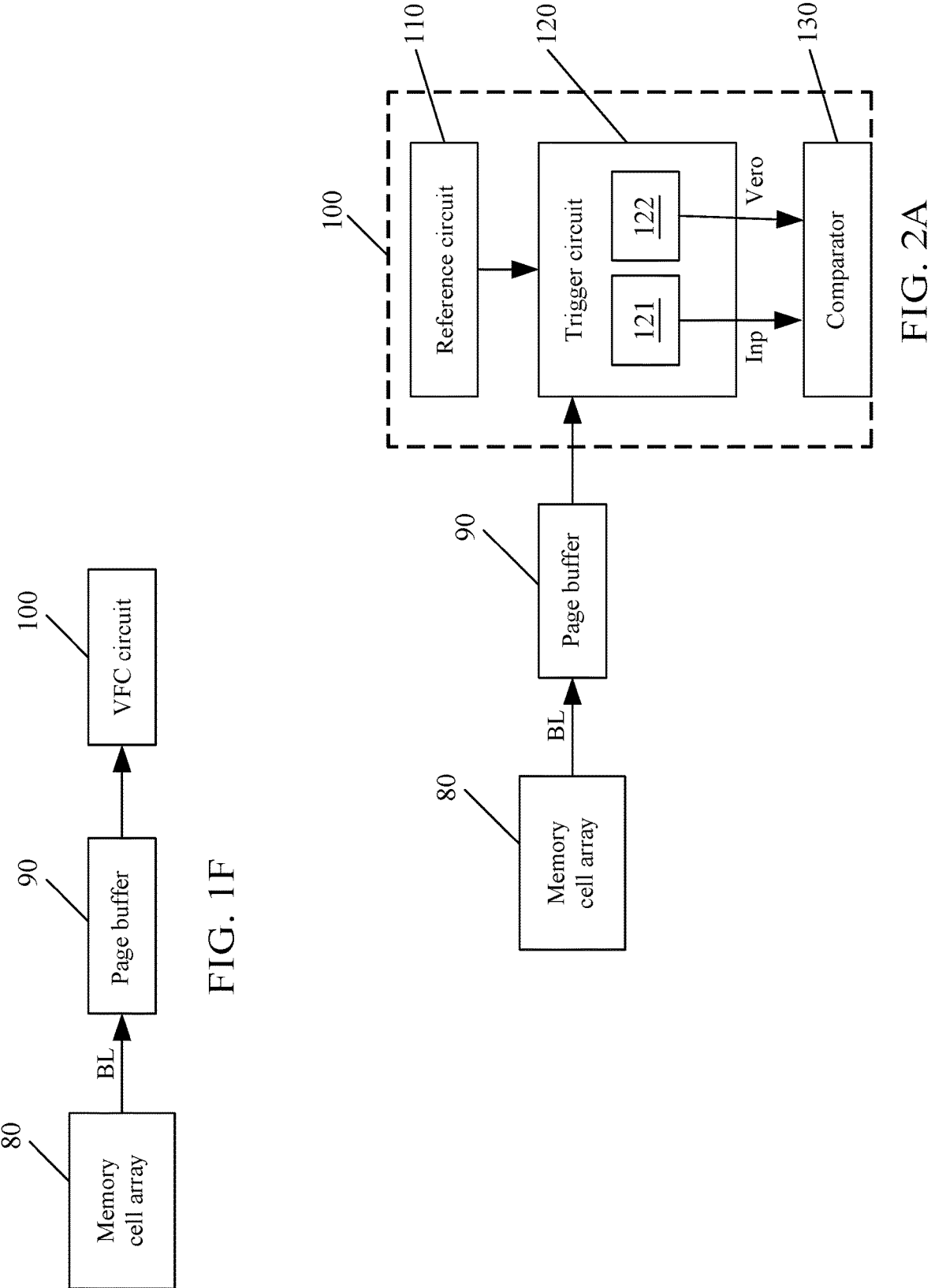
FIG. 1F is a schematic structural diagram of a memory comprising a VFC circuit provided by an implementation of the present disclosure.
FIGS. 2A to 2C are schematic structural diagrams of a VFC circuit provided by an implementation of the present disclosure.

In an implementation of the present disclosure, as shown in FIG. 1F, a VFC circuit structure in a memory is shown. In the VFC circuit structure, a memory cell array 80 may be connected with a page buffer 90 via a bit line (BL), and the page buffer 90 is connected with a VFC circuit 100. The memory cell array 80 may include a plurality of memory cells, and a current signal will be output from the page buffer to the VFC circuit 100 after programming operations. If a memory cell passes programming verification, then a corresponding data pathway will have no current signal or have zero current flowing therethrough. If a memory cell fails to pass programming verification, then the page buffer of the bit line branch corresponding to the memory cell will output a corresponding current signal. Current signals on a plurality of bit lines are accumulated, which is a test signal obtained from verification of the memory.

As shown in FIG. 2A, an implementation of the present disclosure provides a memory that includes a memory cell array 80 and a peripheral circuit including at least VFC circuit 100. The VFC circuit 100 includes a trigger circuit 120 including a reference signal output circuit 121 and a fail bit signal output circuit 122, and a comparator 130 coupled with the trigger circuit 120. The fail bit signal output circuit 122 is configured to generate a fail bit signal Vero according to the test signal obtained from verification of the memory, and the reference signal output circuit 121 is configured to output at least one reference signal Inp. The comparator 130 is configured to compare the fail bit signal Vero with the plurality of reference signals Inp sequentially to obtain a verification result.

In one implementation of the present disclosure, the above-mentioned VFC circuit 100 may further include a reference circuit 110. The reference circuit 110 may be configured to receive an externally input signal such as a clock signal, an enable signal or a voltage/current signal to enable the VFC circuit 100 to initiate the verify failbit count.

Figure 2B:
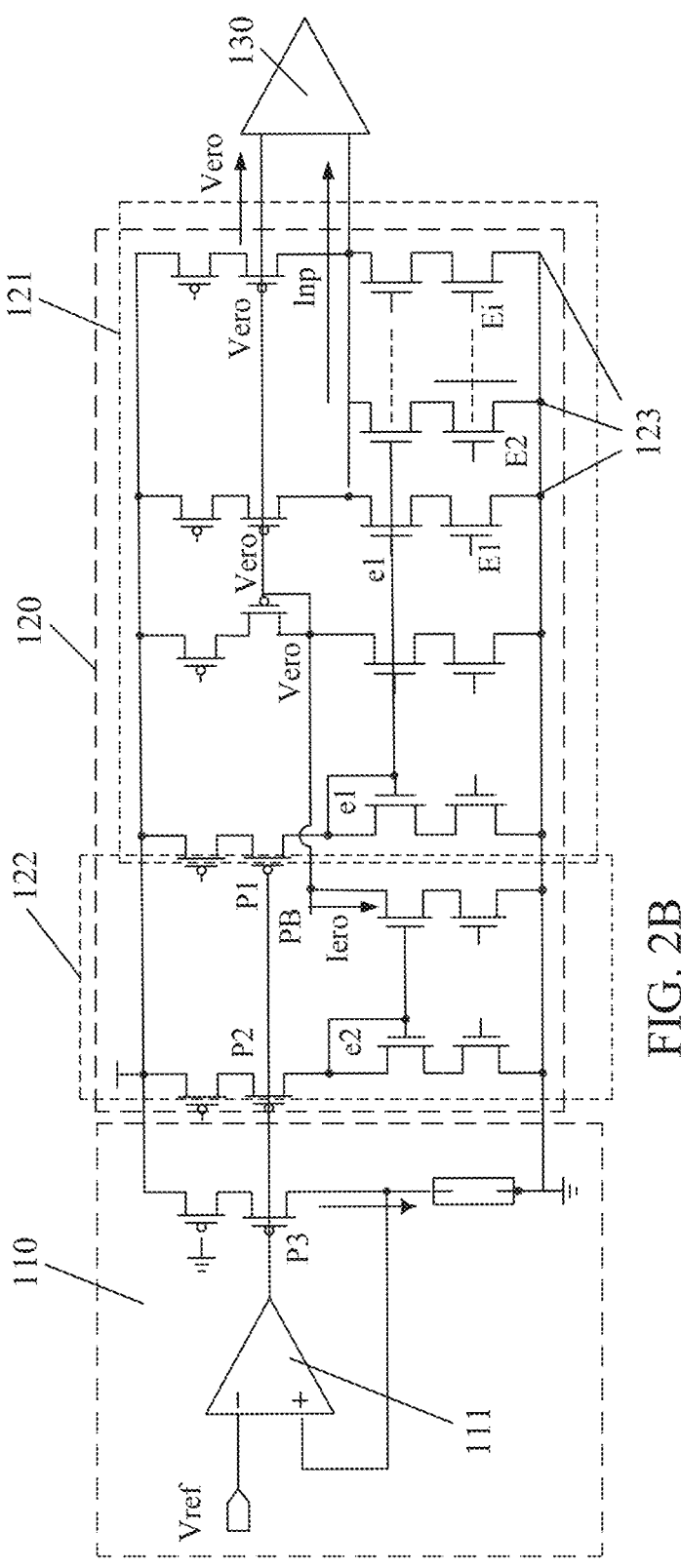

In some implementations, the reference circuit 110 is connected with the trigger circuit 120 and configured to output a control signal to the trigger circuit 120 based on the externally input signal, wherein the control signal is configured to enable the trigger circuit 120. As shown in FIG. 2B, the reference circuit 110 may include a comparator 111 that is configured to receive an externally input signal Vref and output an enable signal to the trigger circuit 120 depending on the magnitude of the signal Vref. The enable signal is used to turn on some control switches in the trigger circuit 120, and thus serves to enable the trigger circuit 120.

As shown in FIG. 2B, the signal output from the reference circuit 110 is configured to provide gate control signals for transistors P1, P2 and P3. When the output of the reference circuit is at a low level, P1, P2 and P3 are turned on. At this time, the pathways in which P1 and P2 are located are conductive, so as to generate a first control signal e1 and a second control signal e2. The first control signal e1 is configured to enable the reference signal output circuit 121 to output a plurality of the reference signals Inp, and the second control signal e2 is configured to enable the fail bit signal output circuit 122 to receive the test signal Iero.

After the second control signal e2 turns on a NMOS transistor connected thereto, a PB node may receive the test signal corresponding to the PB side, so that the voltage value Vero corresponding to the test signal Iero may be transferred to the trigger circuit 120 as one of the signals to be compared. The first control signal e1 may enable the reference signal output circuit 121 to output the first reference signal Inp(1) at the beginning and then output different reference signals Inp(i) sequentially until the comparison is terminated.

As shown in FIG. 2B, the reference signal output circuit 121 of the trigger circuit 120 may include a plurality of branches 123 configured to generate a plurality of corresponding reference signals Inp. As shown in FIG. 2B, when turned on, each branch may provide a signal i, and the above-mentioned reference signal Inp is the overall signal obtained by parallel connection of the plurality of branches. Control signals E1, E2 . . . . Ei for the switches in the individual branches 123 of the trigger circuit 120 are configured to turn the plurality of branches 123 of the trigger circuit 120 on or off, so that the overall resistance may be varied to generate the plurality of reference signals Inp of different magnitudes. If more branches 123 in the trigger circuit 120 are turned on, the overall resistance becomes smaller, which makes the overall current output by the branches 123 connected in parallel larger, and makes the voltage value corresponding to reference signal Inp input to the comparator 130 smaller.

The trigger circuit 120 may also be coupled with the memory cell array 80 through other circuits. As shown in FIG. 2B, the trigger circuit 120 is connected to a page buffer (not shown in the figure) through the PB node shown in FIG. 2B, and the page buffer is in turn connected to the memory cell array 80. After verification of the data stored in the memory cell array 80, the corresponding test signal Iero may be obtained through the page buffer. Error information with respect to data being verified may be carried by the test signal Iero. Therefore, the trigger circuit 120 may receive the test signal and generate a corresponding fail bit signal Vero (e.g., the voltage on the PB node). The fail bit signal Vero will be applied to control electrodes of the PMOS switches at the power supply side that are connected with the individual branches 123 in the trigger circuit 120, and the fail bit signal Vero is configured to turn on the pathways at the power supply side to provide current to these branches 123 and at the same time serves as an input signal to the comparator 130, e.g., the signal to be compared. Through the comparison between the fail bit signal Vero and different reference signals Inp, a magnitude range of the fail bit signal Vero may be obtained to indicate the range of the number of fail bits, so that the verification result of the fail bit count may be determined from using the comparison results.

Figure 2C:
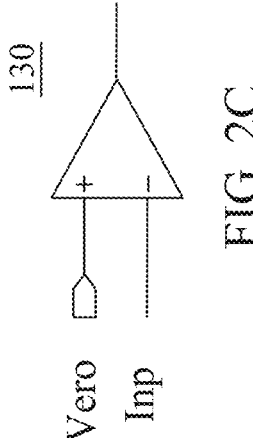

In one implementation of the present disclosure, the comparator 130 may be coupled to the above-mentioned trigger circuit 120. As shown in FIG. 2C, the comparator 130 is a circuit element that compares two voltage signals (e.g., the fail bit signal Vero and reference signal Inp) to determine if they are equal or which of them is larger or smaller. The two signals input to the comparator 130 are analog signals, and the output of the comparator 130 is a binary signal, e.g., "0" or "1" represented by a low level and a high level, respectively. In some implementations, if a specific number of verify fail bits are calculated according to the binary signal, the comparison results from the comparator 130 may be represented by the notation Ver_out<13:0>. Ver_out<13:0> represents a collection of 14 binary output signals obtained by comparing the fail bit signal with 14 different reference signals. If the fail bit signal is larger than the reference signal, then Ver_out<0>=1 is output, or if the fail bit signal is smaller than the reference signal, then Ver_out<0>=0 is output.

FIG. 2B shows a schematic diagram of a VFC circuit in an implementation of the present application, wherein the trigger circuit 120 is configured to generate a plurality of reference signals Inp that may be provided to the same comparator 130 at different times sequentially, and the comparator 130 may compare the fail bit signal Vero with the plurality of reference signals Inp sequentially until the range of the fail bit signal Vero is determined.

In some implementations, the fail bit signal Vero is first compared with the first reference signal Inp. If the result output by the comparator 130 is the binary signal "1", it is indicated that the fail bit signal Vero is larger than the first reference signal. The fail bit signal Vero is then compared with the second reference signal larger than the first reference signal until the result output by the comparator 130 is the binary signal "0", so that the voltage magnitude range of the fail bit signal Vero is determined and thereby the verification result is obtained. Therefore, in the implementation of the present disclosure, the comparator 130 may be multiplexed for different reference signals Inp, so that the footprint occupied by redundant circuit elements can be reduced, the space of the memory can be saved, the power consumption is lowered and the reliability of the memory is improved.

In some implementations, another VFC circuit as shown in FIG. 3 is provided. A trigger circuit (e.g., as shown in the dashed box) of the VFC circuit includes a plurality of branches arranged in parallel and connected with the PB side, and a plurality of branches to output reference signals Inp, and each branch is connected to a comparator. Each set of branches are controlled by a set of controlled switches and output a reference signal Inp when turned on. A different comparator compares each reference signal Inp with the fail bit signal Vero. The fail bit signal and the first reference signal are input to the first comparator. If the output comparison result is at a high level, then it is indicated that the binary signal is "1", and the fail bit signal and the second reference signal are provided to the second comparator that is different from the first comparator. In contrast to the trigger circuit 120 of the VFC circuit provided by the implementation of the present disclosure as shown in FIG. 2B, the trigger circuit in FIG. 3 uses a separate comparator for each comparison process and thus occupies a larger footprint. Furthermore, the second comparator may be turned on while the first comparator is still on, causing increased power consumption and an increased probability of device failure.

In some implementations, as shown in FIG. 4, the reference signal output circuit 121 includes a plurality of branches 123 connected in parallel and configured to output the plurality of reference signals, respectively, wherein each of the branches includes at least one controlled switch 410.

In an implementation of the present disclosure, the above-mentioned trigger circuit 120 may control the plurality of branches 123 to be turned on respectively by the plurality of controlled switches 410. The reference signal Inp may be the trunk current obtained by parallel connection of the plurality of branches, so that the total current from the parallel connection is equal to the sum of the currents from the plurality of branches and different values of the total current correspond to the voltage values for different reference signals Inp.

In an implementation of the present disclosure, by turning on the controlled switches 410 sequentially, the number of the turned-on branches may be gradually increased, so that the plurality of different reference signals Inp are obtained. If more controlled switches 410 are turned on, then more branches are switched into the trigger circuit 120, which makes the trunk current larger and the output voltage value for the reference signal smaller. If fewer controlled switches are turned on, then fewer branches are switched into the trigger circuit 120, which makes the trunk current smaller and the output voltage value for the reference signal larger. The first controlled switch 410 corresponds to the turning-on of the first branch, the second controlled switch 410 corresponds to the turning-on of the second branch, each controlled switch 410 corresponds to each branch, and the number of the controlled switches 410 and the branches is not limited herein. The above-mentioned controlled switches 410 include, but are not limited to, a three-terminal device, e.g., a triode, a field effect transistor and the like, or one or more of any other circuit elements capable of performing a switching function.

In another implementation, the controlled switches 410 on the individual branches 123 described above may have different resistance values to provide different reference signals when turned on. Accordingly, in this instance, different branches 123 are turned on sequentially and only one branch 123 is turned on each time.

In addition, each branch may have an additional controlled switch that is controlled by a signal e1 as shown in FIG. 4. The signal e1 may be obtained by the reference circuit 110 as involved in the implementations above turning the transistor P1 on, so as to achieve a function of enabling the trigger circuit 120.

In an implementation of the present disclosure, the controlled switches may be controlled to be turned on/off by the control signal from the reference circuit, and one controlled switch corresponds to the turning-on of one branch, so that the value of the reference signal may be regulated precisely to improve reliability of comparison results.

In some implementations, the plurality of controlled switches 410 may be configured so that the controlled switch 410 that has received a first enable signal Ei is switched to an ON state for making the corresponding branch 123 conductive and provide the reference signal Inp.

In an implementation of the present disclosure, a plurality of first enable signals E1, E2 . . . Ei, which are input externally, may be received to control the controlled switches 410 to be turned on/off. Furthermore, the plurality of first enable signals E1, E2 . . . Ei may be input to the controlled switches 410 sequentially, so that the controlled switches 410 are triggered sequentially at a time delay. The controlled switches 410 may be transistors and the first enable signals E1, E2 . . . Ei are voltage signals to be applied to the control electrodes of the transistors. The first enable signal may be at a high level and, when a corresponding branch 123 receives the high-level signal, the controlled switch 410 on the branch 123 may be turned on.

In some other implementations, the first enable signals E1, E2 . . . Ei above may be the comparison result of the previous branch 123 which is fed back to the current branch 123 and is used as an enable signal to the current branch 123 so as to achieve sequential comparison operations.

In some implementations, as shown in FIG. 5, two comparators 130 are included, and the reference signal output circuit 121 includes at least two sub output circuits, each of which includes at least one branch 123 and is connected to one said comparator 130, such that the number of the sub output circuits is equal to that of the comparators 130.

In the above-described implementation, the fail bit signal Vero may be compared with a plurality of different reference signals Inp at different times sequentially, so that only one comparator 130 is needed. In some implementations, for equalization of time delays, multiple comparators 130 may also be used. For example, the plurality of branches 123 in the trigger circuit 120 described above may be divided into groups and each group of branches share one comparator 130. Branches 123 for the reference signals Inp to be compared may be divided into two groups (a low bit number group and a high bit number group) or three groups (a low bit number group, a middle bit number group and a high bit number group). The number of groups may be determined depending on the precision of practical verify failbit count.

As shown in FIG. 5, the plurality of branches 123 of the trigger circuit 120 may be divided into two sub output circuits comprising a low bit number group 510 and a high bit number group 520. The low bit number group 510 may represent a bit number range of the number of fail bits from 1 to 9, and the high bit number group 520 may represent a bit number range of the number of fail bits from 10 to 25, so that the two groups of branches 123 provide different reference signals respectively. The reference signals Inp output from the two groups of branches and the fail bit signal Vero are input to different comparators 130 respectively, so that corresponding comparison parameters may be obtained respectively. The upper limit of the bit number may be determined according to the number of the memory cells in the memory cell array that fail to pass the programming verification.

The term "bit" above refers to the minimum storage unit of the memory, e.g., the data stored in one memory cell in the memory cell array 80. Taking a single level cell as an example, the programming state of the memory cell may be binary information "0" or "1", wherein the binary information "1" may indicate that the memory cell has not been programmed or suffers from a programming failure (e.g., failing to pass the programming verification) and the binary information "0" may indicate that the memory cell has been programmed and passed the programming verification. The number of the memory cells that suffer from a programming failure may be latched in the page buffer in the form of the above-described bit number and may be counted in the form of an electrical signal by the VFC circuit 100. Specifically, the page buffer inputs the test signal Iero to the VFC circuit 100, which converts the test signal Iero into the fail bit signal Vero to be compared sequentially with the plurality of reference signals Inp output from the trigger circuit inside the VFC circuit 100. Because a plurality of different reference signals Inp may be provided by turning on different numbers of branches 123, grouping the controlled switches 410 based on the bit number as described above may facilitate to determine the number range of fail bits intuitively.

In an implementation, one comparator 130 is multiplexed by each sub output circuit. For example, the controlled switches 410 may be divided into the first group (the low bit number group) and the second group (the high bit number group). The first group may use the first comparator 130 to determine whether the number of fail bits is within the low bit number range and the second group may use the second comparator 130 to determine whether the number of fail bits is within the high bit number range. The low bit number range and the high bit number range here may vary with the number of the sub output circuits. The larger the number of the sub output circuits is, the smaller the number range of fail bits corresponding to each sub output circuit is, the more precisely the number of fail bits is determined, and the larger the number of comparators 130 is. The smaller the number of groups is, the larger the number range of fail bits corresponding to each group is, the more roughly the number of fail bits is determined, and the smaller the number of comparators 130 is.

In one implementation of the present disclosure, a plurality of sub output circuits are provided and one corresponding comparator 130 is multiplexed by the branches 123 in each sub output circuit to compare the fail bit signal with a plurality of reference signals sequentially. Furthermore, the comparators 130 may perform comparison independently from each other each time. Thereby, the footprint occupied by circuit elements can be reduced, space can be saved, efficiency of comparison can be increased and reliability of the VFC circuit 100 can also be improved.

In some implementations, the comparator 130 has an input terminal connected with the trigger circuit 120 and is configured to compare the fail bit signal with one reference signal to output a comparison parameter, continue the comparison with the next reference signal if the comparison parameter indicates that the fail bit signal is larger than the reference signal, or stop the comparison and output a verification result if the comparison parameter indicates that the fail bit signal is smaller than or equal to the reference signal.

In an implementation of the present disclosure, each of the above-described comparators 130 may have at least two input terminals and one output terminal, wherein the two input terminals are configured to receive the fail bit signal generated by the trigger circuit 120 and one reference signal output from the trigger circuit 120, respectively, and the one output terminal is configured to output the result of the comparison, e.g., the above-mentioned comparison parameter. The comparison parameter herein may be a binary signal "0" or "1". If the fail bit signal is larger than the reference signal being compared, the binary signal "1" is output to indicate that the number of memory cells that fail to pass programming verification is larger than the bit number corresponding to the current reference signal, and that a next comparison operation needs to be performed. If the fail bit signal is smaller than or equal to the reference signal being compared, the binary signal "0" is output to indicate that the number of memory cells that fail to pass programming verification is already smaller than or equal to the bit number corresponding to the current reference signal or falls within the bit number range corresponding to the current reference signal, so that the comparison may be terminated and a verification result has been obtained.

In one implementation of the present disclosure, the comparator 130 may compare the fail bit signal with a plurality of reference signals sequentially to determine stepwise whether the number of memory cells that fail to pass programming verification falls within the bit number range corresponding to the current reference signal. Thereby, the comparison efficiency and precision can be increased and the reliability of the VFC circuit 100 can be improved.

In some implementations, as shown in FIG. 6A, the VFC circuit 100 in peripheral circuit of the memory further includes a time delay circuit 140 coupled with the comparator 130 and configured to receive a plurality of second enable signals en sequentially to output delay signals and delay a plurality of the comparison parameters output from the comparator 130 according to the plurality of received delay signals respectively to output the delayed comparison parameters.

In the implementation of the present disclosure, the comparator 130 may be configured to compare the fail bit signal with a plurality of reference signals sequentially and thus be multiplexed, so that one comparator 130 may output a plurality of comparison parameters. In order to distinguish the above-mentioned plurality of comparison parameters effectively, in the implementation of the present disclosure, the comparator 130 may be coupled with the time delay circuit 140 to distinguish the comparison parameters by applying corresponding time delays. As shown in FIG. 6B, before the comparator 130 outputs comparison parameters, the above-mentioned time delay circuit 140 may receive second enable signals en0 . . . en6 to output corresponding delay signals a0 . . . a6. The second enable signals may be a high level signal and be configured to trigger the time delay circuit 140 to output corresponding delay signals. The delay signals here may be a high-level signal that lasts for a time period Δt. In addition, the second enable signals en0 . . . en6 may be provided to the time delay circuit 140 sequentially in a preset order according to a clock signal or any other external signal.

The time delay circuit 140 may have a plurality of time delay branches corresponding to the plurality of comparison parameters described above respectively. For example, each of the time delay branches is configured to delay a comparison parameter obtained from the comparison between each reference signal and the fail bit signal. In addition, one time delay module may be multiplexed by the plurality of time delay branches of the time delay circuit 140. The time delay module may output delay signals respectively corresponding to the second enable signals en0 . . . en6 of individual branches so as to reduce power consumption of redundant time delay modules. Other technical solutions, such as those in which each time delay branch is provided with one time delay module or multiple time delay branches are provided with one time delay module, still fall within the scope of the present disclosure.

As shown in FIG. 6C, when the comparator 130 outputs a first comparison parameter out0, the above-mentioned time delay circuit 140 may receive a second enable signal en0 so as to trigger the corresponding time delay branch to generate a first delay signal a0, which can delay the first comparison parameter out0 through an AND gate 610, so that the first delayed comparison parameter a0_1 is output. The plurality of output terminals of the time delay circuit 140 may be connected to a plurality of AND gates 610, respectively. Since the plurality of output terminals of the time delay circuit 140 output delay signals at different times, the delayed comparison parameters a0_1 to a6_1 finally output from the plurality of AND gates 610 are also output at different times. Thereby, one comparator 130 may be used to process different reference signals respectively, obtain comparison results corresponding to the individual reference signals at different times, and thus the comparator 130 is multiplexed.

The above-mentioned delay signals are at a high level, and if a comparison parameter is at a high level, then the delayed comparison parameter given by the AND gate is also at a high level. If a comparison parameter is at a low level, then the delayed comparison parameter given by the AND gate is also at a low level. Therefore, the above-mentioned time delay circuit 140 will not change the binary information corresponding to the individual comparison parameters output from the comparator 130, and may still distinguish the plurality of comparison parameters.

In one implementation of the present disclosure, the time delay circuit 140 may be used to distinguish comparison parameters from the comparator 130 effectively so as to increase the precision of the verify fail bitcount and improve reliability of the product.

In some implementations, as shown in FIG. 7A, the VFC circuit 100 in the peripheral circuit further includes a latch circuit 150 comprising a plurality of latches coupled with the time delay circuit 140, wherein the latches are configured to store the delayed comparison parameters and the number of the latches is the same as that of the reference signals.

In one implementation of the present disclosure, a multiplexed comparator 130 may generate a plurality of comparison parameters that are independent from each other and are to be delayed by the time delay circuit 140 to calculate the number of fail bits, so that the verification result is obtained. Therefore, the latch circuit 150 may be coupled with the above-mentioned time delay circuit 140 and latch the delayed comparison parameters for a subsequent calculation. The latch circuit 150 may convert the binary information "0" or "1" into an electrical level signal to be latched and hold the level state of the electrical level signal. Each delayed comparison parameter may correspond to one latch and in this way the above-mentioned latch circuit 150 is constructed. Therefore, the number of the latches is the same as that of the reference signals, so that the delayed comparison parameter obtained from each comparison operation may be stored in a separate latch.

In some implementations, the latch circuit 150 is also coupled with the trigger circuit 120, wherein the latches are configured to convert the delayed comparison parameters into latch signals and latch the latch signals into the corresponding latches, and output feedback signals according to the latch signals, wherein the feedback signals are configured to trigger the trigger circuit 120 to switch the reference signal to be compared.

In an implementation of the present disclosure, a structural diagram of a latch 151 in the above latch circuit 150 is as shown in FIG. 7B. The latch 151 may have a field effect transistor (FET) 710 and a latch unit 720, wherein the control terminal of the FET 710 receives the above-mentioned delayed comparison parameter, e.g., ax_1. For example, the control terminal is connected to the output terminal of the above-described AND gate 610, and thus may be configured to activate the latch unit 720 to enable the data latching. If the delayed comparison parameter is the binary information "1", then the FET 710 is turned on, and the binary information may be converted into an electrical level signal (e.g., a high level signal) within the latch and may be latched as an input to the latch unit 720. If the delayed comparison parameter is the binary information "1", e.g., a high level voltage signal, then the FET 710 is turned on and the ground voltage reaches the latch unit 720 through the FET 710. The latch unit 720 inverts the phase of the ground voltage signal and obtains a high level voltage signal as the latch signal b_0, so that the latching is achieved.

Further, the structure of the latch unit 720 may be as shown in FIG. 7C. Before latching, the control terminal Y of the latch unit 720 is Y="1". When the delayed comparison parameter is input to the latch through the above-mentioned turned-on FET 710, the delayed comparison parameter needs to be latched into the corresponding latch unit 720. At this time, the state of the control terminal Y of the latch unit is changed from "1" to "0", and the high level signal converted from the binary information "1" is input to the latch unit at the other input terminal A of the latch unit so as to be latched. If the above-mentioned information is needed later, the state of the control terminal Y of the latch unit is changed from "0" to "1", so that the latching is cancelled, and the corresponding high level information is output from the output terminal B.

Furthermore, the above-mentioned latch 151 may output a corresponding feedback signal according to the latched electrical level information. The feedback signal may be an electrical level signal, a clock signal or any other feedback signal. The latched information being at a high level indicates that the delayed comparison parameter input to the latch is the binary information "1" and further indicates that the fail bit signal is larger than the current reference signal, e.g., the number of fail bits is not within the currently compared bit number range. Therefore, a feedback signal of a high level is output according to the latched high level information and may be input to the trigger circuit coupled with the above-mentioned latch circuit to make the trigger circuit generate a new first enable signal that is configured to turn on the corresponding controlled switch and thus initiate a new reference signal to be compared with the fail bit signal in a new comparison operation. A plurality of cycles may be performed sequentially, until the fail bit signal is smaller than or equal to the current reference signal, at which point the latched information in the latch is at a low level and the corresponding feedback signal is also at a low level, so that no new first enable signal will be generated by the trigger circuit and no corresponding controlled switch is turned on and thus the comparison is terminated. Finally, a corresponding verification result is obtained through a subsequent calculation.

In one implementation of the present disclosure, the above-mentioned delayed comparison parameters may be latched by the latch circuit 150 and feedback signals are output from the latch circuit 150 to the trigger circuit 120 which is configured to determine from the latched information whether to perform a next comparison operation. In this way, delayed comparison parameters can be preserved effectively to reduce data loss, and feedback signals are introduced to change the conditions for turning on the controlled switches 410 in trigger circuit 120. As a result, reliability of the VFC circuit 100 is improved.

In some implementations, as shown in FIG. 8, the VFC circuit 100 in the memory further includes a code system conversion circuit 160 coupled with the latch circuit 150 and configured to convert the latch signals into binary codes that are configured for calculation of the verification result.

In an implementation of the present disclosure, the latched information in the latches 151 is not capable of intuitively expressing the number of memory cells that fail to pass the programming verification. Therefore, the latch circuit 150 may be coupled with the code system conversion circuit 160 and, as a result, the electrical level signal corresponding to the latched information is converted into a binary code that can be more easily identified. Correspondingly, a high level may be converted into the binary code "1" and a low level may be converted into the binary code "0". In this way, the electrical signal is converted into a digital signal that can express the verification result more conveniently, more briefly and more intuitively, and thus reliability of the VFC circuit 100 is improved.

In some implementations, as shown in FIG. 9, the VFC circuit 100 in the memory further includes an accumulator 170 coupled with the code system conversion circuit 160 and configured to accumulate a plurality of the binary codes obtained from the code system conversion circuit 160 to obtain the verification result of the fail bit count.

In one implementation of the present disclosure, the latch signals are each converted to corresponding binary signals which may be then accumulated to obtain the number of fail bits of the whole memory cell array. Therefore, the above-mentioned code system conversion circuit 160 may be coupled with the accumulator 170, which can include a register. The accumulator 170 may be initialized before calculation of the verification result, and then accumulate the plurality of binary codes obtained from the code system conversion circuit 160 to obtain the total number of fail bits found after multiple times of comparison by the VFC circuit 100, so that the verification result of fail bit count is finally obtained.

In some implementations, the latch circuit 150 is further configured to receive a reset signal to reset the latch signal.

In one implementation of the present disclosure, as shown in FIG. 10, each of the latches 151 in the above-mentioned latch circuit may further include a FET 730 configured to receive a reset signal. The input terminals of the FETs 730 of the latches may be at the same circuit node. For example, when the latch circuit 150 receives a reset signal, all the latches in the latch circuit 150 will receive the same reset signal and reset the information latched in the latch units. One latch may latch a high level information, and one latch may latch a low level information. However, when the reset signal is received, all the latches are reset to a low level and the control terminals of the latch units are reset to "1".

In an implementation of the present disclosure, after a control signal is output from the reference circuit to the trigger circuit 120, the reset signal is input to the latch circuit 150 to make the latches hold an ON-state before latching the delayed comparison parameters. In this way, the manner in which the VFC circuit 100 is triggered is changed, so that the accuracy of the latched information is increased, the precision of the feedback signals is increased and the reliability of the memory is improved.

Furthermore, as shown in FIG. 11, an implementation of the present disclosure further provides a control method of a VFC circuit, such as VFC circuit 100, of a semiconductor memory, comprising: at step S10, outputting at least one reference signal; at step S20, generating a fail bit signal according to a test signal obtained from verification of the memory; and at step S30, comparing the fail bit signal with the plurality of reference signals sequentially to obtain a verification result.

In one implementation of the present disclosure, the reference circuit may be configured to receive an external control signal, such as a clock signal or an enable signal, to enable the VFC circuit to initiate verify failbit count. Correspondingly, the reference circuit may convert the external signal into an internal control signal and output it, and the internal control signal is configured to control a corresponding unit in the VFC circuit to output a plurality of reference signals. The plurality of reference signals may be controlled by a plurality of controlled switches in the trigger circuit that are in turn controlled to be turned on/off by the control signals from the reference circuit. Therefore, if more controlled switches are turned on, then more branches are switched into the trigger circuit, which makes the reference signal on the trunk larger. If fewer controlled switches are turned on, then fewer branches are switched into the trigger circuit, which makes the reference signal on the trunk smaller.

When activated, the VFC circuit may receive a test signal, and generate a fail bit signal according to a control signal output from the reference circuit. The fail bit signal is a current, received by the page buffer, corresponding to the number of fail bits, and is configured to indicate the number of the memory cells in the memory cell array that fail to pass programming verification. The memory cell array may be coupled with the page buffer via bit lines, and if a memory cell fails to pass programming verification, then the page buffer of the bit line branch corresponding to the memory cell will output a corresponding current signal, which will be processed by the VFC circuit to obtain and output the number of the memory cells that fail to pass programming verification, so as to achieve the counting of fail bits during verification. The above-mentioned steps S10 and S20 are two independent steps, which may be performed sequentially or concurrently in practical operations.

The fail bit signal may be compared with a plurality of reference signals sequentially by the comparator of the VFC circuit to obtain the verification result. In one implementation of the present disclosure, the comparator may be multiplexed by sequential comparison operations, so that footprint occupied by circuit elements can be reduced, space can be saved, power consumption is lowered and reliability of the memory is improved.

In some implementations, the control method further includes receiving a plurality of first enable signals sequentially, wherein the controlled switches having received the first enable signals are switched to an ON state and the branches connected with the ON-state controlled switches are conductive and are configured to provide the reference signals.

In one implementation of the present disclosure, the VFC circuit may receive a plurality of first enable signals according to the control signals from the reference circuit to control the controlled switches to be turned on or off. Furthermore, the plurality of enable signals may be input to the controlled switches sequentially, so that the controlled switches are triggered sequentially at a time delay. The enable signals may be applied as electrical signals to the branches corresponding to the controlled switches to control the controlled switches to be turned on. The first enable signal may be at a high level and, when a corresponding branch receives the high-level signal, the controlled switch on the branch may be turned on.

In some implementations, comparing the fail bit signal with the plurality of reference signals sequentially to obtain a verification result includes: comparing the fail bit signal with one reference signal to output a comparison parameter; delaying the comparison parameter according to a delay signal corresponding to the comparison parameter to output a delayed comparison parameter; converting the delayed comparison parameter into a latch signal and latching the latch signal into the corresponding latch; comparing the fail bit signal with a next reference signal if the latch signal indicates that the fail bit signal is larger than the reference signal, until the delayed comparison parameter indicates that the fail bit signal is smaller than or equal to the reference signal; converting the latch signals latched in the plurality of latches into binary codes respectively; and accumulating the plurality of binary codes to obtain the verification result of the fail bit count.

In one implementation of the present disclosure, the above-mentioned fail bit signal may be compared with a plurality of reference signals sequentially by the comparator of the VFC circuit. Specifically, after the fail bit signal is compared with one reference signal, a corresponding comparison parameter may be output, wherein the comparison parameter may be a binary signal "0" or "1".

In one implementation of the present disclosure, the VFC circuit may include a time delay circuit configured to output preset delay signals that are configured to delay the plurality of comparison parameters output from the above-mentioned comparator so as to distinguish the plurality of comparison parameters output from the same one comparator. The delay signals here may be a high-level signal that lasts for a time period $\Delta t$. When the comparator outputs a comparison parameter, the comparison parameter and a corresponding delay signal pass through an AND gate, so that a corresponding delayed comparison parameter is output. If a comparison parameter is at a high level, the delayed comparison parameter given by the AND gate is also at a high level; or on the contrary, if a comparison parameter is at a low level, the delayed comparison parameter given by the AND gate is also at a low level. As a result, the above-mentioned time delay circuit will not change the binary information corresponding to the comparison parameter output from the comparator.

Subsequently, in one implementation of the present disclosure, the above-mentioned delayed comparison parameters may be latched in the latches. The latch here may convert the binary information "0" or "1" into an electrical level signal to be latched and hold the level state of the electrical level signal. Each of delayed comparison parameters may correspond to one latch, and in this way the latch circuit within the VFC circuit is constructed.

If the fail bit signal is larger than the reference signal being compared, then the binary signal "1" is output by the comparator and the corresponding latch latches a corresponding high level to indicate that the number of memory cells that fail to pass programming verification is larger than the bit number corresponding to the current reference signal and a next comparison operation needs to be performed; or if the fail bit signal is smaller than or equal to the reference signal being compared, then the binary signal "0" is output by the comparator and the corresponding latch latches a corresponding low level to indicate that the number of memory cells that fail to pass programming verification is already smaller than or equal to the bit number corresponding to the current reference signal or falls within the bit number range corresponding to the current reference signal, so that the comparison may be terminated and a verification result will be obtained through a subsequent calculation.

The electrical level signals latched in the latches may be convert into binary codes, which may be more easily identified, by a code system conversion circuit in the VFC circuit. Correspondingly, a high level may be converted into the binary code "1" and a low level may be converted into the binary code "0". Furthermore, an accumulator is initialized before the calculation of the verification result, and then accumulates the plurality of binary codes obtained from the code system conversion circuit to obtain the total number of fail bits found after multiple times of comparison by the VFC circuit, so that the verification result of fail bit count is finally obtained.

In some implementations, the comparing the fail bit signal with the next reference signal if the latch signal indicates that the fail bit signal is larger than the reference signal includes: outputting a feedback signal by the corresponding latch according to the latch signal; and outputting to the next controlled switch the corresponding first enable signal if the feedback signal indicates that the fail bit signal is larger than the reference signal, wherein the controlled switch that has received the first enable signal is switched to an ON state and the trigger circuit generates the next reference signal which is then compared with the fail bit signal.

In one implementation of the present disclosure, the latched information being at a high level indicates that the delayed comparison parameter input to the latch is at a high level and further indicates that the fail bit signal is larger than the current reference signal, e.g., the number of fail bits is not within the currently compared bit number range. Therefore, a feedback signal of a high level needs to be output according to the latched high level information and may be input to the trigger circuit coupled with the above-mentioned latch circuit to make the trigger circuit generate a new first enable signal that is configured to turn on the corresponding controlled switch and thus initiate a new reference signal to be compared with the fail bit signal in a new comparison operation. A plurality of cycles may be performed sequentially, until the fail bit signal is smaller than or equal to the current reference signal, at which point the latched information in the latch is at a low level and the corresponding feedback signal is also at a low level, so that no new first enable signal will be generated by the trigger circuit and no corresponding controlled switch is turned on and thus the comparison is terminated. A corresponding verification result will be obtained through the calculation of the code system conversion system and the accumulator described above.

In some implementations, FIG. 12 shows a timing diagram for controlling a memory provided by an implementation of the present disclosure. At time T0, the reference circuit may receive a control signal En_ref (a total enable signal, not shown in the figure) from the outside to activate the VFC circuit. At time T1, a reset signal Rst_latch (not shown in the figure) is applied to the latch circuit to make the current latch remain at a low level and restore its latching capability. Subsequently, the control signal output from the reference circuit turns on the PMOS transistors P1, P2 and P3 in the trigger circuit 120. As a result, enable signals e1 and e2 are generated. This makes the trigger circuit 120 generate a corresponding fail bit signal Vero and reference signal Inp at time T2. Then, the controlled switch on the branch 123 of the trigger circuit receives the corresponding first enable signal E1 at time T3, and the time delay circuit 140 receives the corresponding second enable signal en0. The corresponding first comparison parameter output from the comparator 130 is delayed from time T3 to time T4 by the preset delay signal a0 output from the time delay circuit, so that the delayed comparison parameter ax_1 (at this time a0_1, corresponding to the binary information "1") is output and transferred to the latch 151. The electrical level signal b_0 latched in the corresponding latch 151 is at a high level, and the electrical level signal is a feedback signal, and serves as the first enable signal E2 for the next branch 123. Therefore, the comparison between the fail bit signal and the next reference signal will be continued.

The feedback signal b_0 output from the latch 151 makes the trigger circuit receive the first enable signal E2, so that the controlled switch on the next branch 123 is turned on to output the next reference signal Inp which has a different voltage value from that of the previous output reference Inp. The time delay circuit 140 may also trigger a new second enable signal en1 and output a preset delay signal a1. A plurality of cycles may be performed, until at time T6 a first comparison parameter output from the comparator 130 is the binary information "0". Accordingly, the corresponding delayed comparison parameter is also "0" and the corresponding latch latches a low level, causing the feedback signal not to trigger a corresponding enable signal. Then the verification is terminated. Subsequently, the code system conversion circuit converts the electrical level information latched in the latch circuit into binary codes which are input to the accumulator to obtain the final verification result. For example, the number of the memory cells that fail to pass verification during this programming operation falls within the bit number range corresponding to the third reference signal.

For the timing diagram as shown in FIG. 12, the comparison result obtained after three comparison operations is taken as an example. For example, at the third comparison operation, the obtained delayed comparison parameter a2_1 in the latch is at a low level, indicating that the current fail bit signal is larger than the reference signal. The electrical level signal b_2 in the latch 151 is at a low level and will not turn on the next branch 123 when fed back to the next branch 123 as the first enable signal E4, so that the subsequent comparison is terminated and correspondingly the electrical level signals such as b_3 to b_12 latched in the subsequent latches are also at a low level.

Wherever no collisions occur, the features disclosed in the method or device implementations provided by the present disclosure may be combined as desired to obtain new method or device implementations.

What have been described above are example implementations of the present disclosure. However, the scope of the present disclosure is not limited thereto and variations or substitutions based upon the technical scope disclosed by the present disclosure are encompassed by the present disclosure.

What is claimed is:

1. A memory comprising a memory cell array and a peripheral circuit, the peripheral circuit comprising:
   a trigger circuit comprising:
      a fail bit signal output circuit configured to:
         receive a test signal in a current representation, the test signal obtained from verification of the memory; and
         generate a fail bit signal according to the test signal obtained from verification of the memory, wherein the fail bit signal is a voltage representation of the test signal; and
      a reference signal output circuit coupled to the fail bit signal output circuit and configured to:
         receive the fail bit signal from the fail bit signal output circuit; and
         output at least one reference signal at least partially based on the fail bit signal; and
   a comparator coupled with the trigger circuit and configured to compare the fail bit signal with the at least one reference signal to output a verification result.

2. The memory of claim 1, wherein the reference signal output circuit comprises a plurality of branches and controlled switches, wherein the plurality of branches are connected in parallel and configured to output the at least one reference signal respectively, and wherein each of the branches comprising at least one controlled switch of the controlled switches.

3. The memory of claim 2, wherein the controlled switches are configured so that the controlled switch having received a first enable signal is switched to an ON state for making the corresponding branch conductive and provide the at least one reference signal.

4. The memory of claim 2, wherein the comparator comprises at least two comparators, and the reference signal output circuit comprises at least two sub output circuits, each of which comprises at least one branch and is connected to one of the at least two comparators, wherein a number of the sub output circuits is equal to that of the comparators.

5. The memory of claim 1, wherein the comparator has an input terminal connected to the trigger circuit and is configured to:
   compare the fail bit signal with one reference signal of the at least one reference signal to output a comparison parameter;
   continue the comparison with a next reference signal of the at least one reference signal if the comparison parameter indicates that the fail bit signal is larger than the one reference signal; and stop the comparison and output the verification result if the comparison parameter indicates that the fail bit signal is smaller than or equal to the one reference signal.

6. The memory of claim 5, wherein the peripheral circuit further comprises a time delay circuit coupled with the comparator and configured to:

receive a plurality of second enable signals sequentially to output delay signals; and delay a plurality of the comparison parameters output from the comparator according to the plurality of second enable signals respectively to output delayed comparison parameters.

7. The memory of claim 6, wherein the peripheral circuit further comprises a latch circuit comprising a plurality of latches coupled with the time delay circuit, wherein the latches are configured to store the delayed comparison parameters and a number of the latches is the same as that of the reference signals.

8. The memory of claim 7, wherein the latch circuit is also coupled with the trigger circuit and the latches are configured to:

convert the delayed comparison parameters into latch signals and latch the latch signals into corresponding latches; and output a feedback signal according to the latch signals, wherein the feedback signal is configured to trigger the trigger circuit to switch the one reference signal to be compared.

9. The memory of claim 8, wherein the memory further comprises a code system conversion circuit coupled with the latch circuit and configured to convert the latch signals into binary codes, wherein the binary codes are configured for calculation of the verification result.

10. The memory of claim 9, wherein the peripheral circuit further comprises an accumulator coupled with the code system conversion circuit and configured to accumulate a plurality of the binary codes obtained from the code system conversion circuit to obtain the verification result of a fail bit count.

11. The memory of claim 8, wherein the latch circuit is further configured to receive a reset signal to reset the latch signals.

12. The memory of claim 1, wherein the peripheral circuit further comprises a reference circuit connected with the trigger circuit and configured to output a control signal to the trigger circuit based on an externally input signal, wherein the control signal is configured to enable the trigger circuit.

13. The memory of claim 12, wherein the control signal comprises a first control signal and a second control signal, wherein the first control signal is configured to enable the reference signal output circuit to output a plurality of the at least one reference signals, and the second control signal is configured to enable the fail bit signal output circuit to receive the test signal.

14. A method of controlling a peripheral circuit of a memory, the method comprising:

receiving a test signal in a current representation, the test signal obtained from verification of the memory;

generating a fail bit signal according to the test signal obtained from verification of the memory, wherein the fail bit signal is a voltage representation of the test signal;

outputting at least one reference signal at least partially based on the fail bit signal;

and comparing the fail bit signal with the at least one reference signal determined at least partially based on the fail bit signal to output a verification result.

15. The method of claim 14, wherein the control method further comprises receiving a plurality of first enable signals sequentially, wherein a controlled switch having received a first enable signal of the plurality of first enable signals is switched to an ON state, and a branch connected with the controlled switch at the ON state is conductive and is configured to provide the at least one reference signal.

16. The method of claim 15, wherein comparing the fail bit signal with the at least one reference signal to output the verification result comprises:

comparing the fail bit signal with one reference signal of the at least one reference signal to output a comparison parameter;

delaying the comparison parameter according to a corresponding delay signal corresponding to the comparison parameter to output a delayed comparison parameter;

converting the delayed comparison parameter into a latch signal and latching the latch signal into a corresponding latch;

comparing the fail bit signal with a next reference signal of the at least one reference signal when the latch signal indicates that the fail bit signal is larger than the one reference signal, until the delayed comparison parameter indicates that the fail bit signal is smaller than or equal to the one reference signal;

converting the latch signals latched in a plurality of latches into binary codes respectively; and accumulating a plurality of the binary codes to obtain and output the verification result configured to represent a fail bit count.

17. The method of claim 16, wherein the comparing the fail bit signal with the next reference signal when the latch signal indicates that the fail bit signal is larger than the one reference signal comprises:

outputting a feedback signal by the latch according to the latch signal; and outputting the first enable signal to a next said controlled switch when the feedback signal indicates that the fail bit signal is larger than the one reference signal, wherein the controlled switch having received the first enable signal is turned on, and a trigger circuit generates the next reference signal which is then compared with the fail bit signal.

18. The method of claim 16, wherein the control method further comprises receiving a reset signal to reset the latch signals.

19. The method of claim 16, wherein the control method further comprises outputting a control signal based on an externally input signal, wherein the control signal comprises a first control signal configured to enable a plurality of the at least one reference signal to be output and a second control signal configured to enable the test signal to be received.

20. A memory system, comprising:

a memory controller; and a memory coupled to the memory controller, the memory comprising a memory cell array and a peripheral circuit, the peripheral circuit comprising:

a trigger circuit comprising:

a fail bit signal output circuit configured to:

receive a test signal in a current representation, the test signal obtained from verification of the memory; and generate a fail bit signal according to the test signal obtained from verification of the memory, wherein the fail bit signal is a voltage representation of the test signal; and a reference signal output circuit coupled to the fail bit signal output circuit and configured to:

receive the fail bit signal from the fail bit signal output circuit; and output at least one reference signal at least partially based on the fail bit signal; and a comparator coupled with the trigger circuit and configured to compare the fail bit signal with the at least one reference signal to output a verification result.

* * * * *